(12) United States Patent
Yonemori et al.

(10) Patent No.: US 10,264,674 B2
(45) Date of Patent: Apr. 16, 2019

(54) PASSIVE ELEMENT ARRAY AND PRINTED WIRING BOARD

(71) Applicant: Murata Manufacturing Co., Ltd., Nagaokakyo-shi, Kyoto-fu (JP)

(72) Inventors: Keito Yonemori, Nagaokakyo (JP); Hirokazu Yazaki, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/133,736

(22) Filed: Sep. 18, 2018

(65) Prior Publication Data

US 2019/0021166 A1   Jan. 17, 2019

Related U.S. Application Data

(63) Continuation of application No. PCT/JP2017/014871, filed on Apr. 11, 2017.

(30) Foreign Application Priority Data

Apr. 14, 2016  (JP) .................................. 2016-081477
May 6, 2016   (JP) .................................. 2016-093485

(51) Int. Cl.
*H05K 1/11* (2006.01)
*H05K 1/16* (2006.01)
(Continued)

(52) U.S. Cl.
CPC .......... *H05K 1/11* (2013.01); *H01F 27/2804* (2013.01); *H05K 1/028* (2013.01); *H05K 1/14* (2013.01);
(Continued)

(58) Field of Classification Search
None
See application file for complete search history.

(56) References Cited

U.S. PATENT DOCUMENTS

2004/0227258 A1* 11/2004 Nakatani ........... H01L 23/49805
                                                            257/787
2006/0145804 A1   7/2006 Matsutani et al.
(Continued)

FOREIGN PATENT DOCUMENTS

JP   06-302436 A   10/1994
JP   08-250333 A    9/1996
(Continued)

OTHER PUBLICATIONS

Official Communication issued in International Patent Application No. PCT/JP2017/014871, dated Jul. 4, 2017.

*Primary Examiner* — Andargie M Aychillhum
(74) *Attorney, Agent, or Firm* — Keating & Bennett, LLP

(57) ABSTRACT

A passive element array includes an element body that includes laminated base material layers, passive elements at different positions in the element body when viewed from a lamination direction of the base material layers, input/output terminals at a first main surface of the element body and connected to one end of each of the passive elements, input/output terminals at a second main surface of the element body and connected to the other end of each of the passive elements, a first ground terminal between the first input/output terminal and the input/output terminal at the first main surface, and a second ground terminal between the input/output terminal and the input/output terminal at the second main surface.

20 Claims, 14 Drawing Sheets

(51) Int. Cl.
*H01F 27/28* (2006.01)
*H05K 1/02* (2006.01)
*H05K 1/14* (2006.01)
*H05K 1/18* (2006.01)

(52) U.S. Cl.
CPC ............ *H05K 1/165* (2013.01); *H05K 1/181* (2013.01); *H05K 1/185* (2013.01); *H01F 2027/2809* (2013.01); *H05K 2201/1003* (2013.01); *H05K 2201/10015* (2013.01); *H05K 2201/10022* (2013.01); *H05K 2201/10356* (2013.01)

(56) References Cited

U.S. PATENT DOCUMENTS

2012/0027056 A1* 2/2012 Shinkai .................. H01Q 3/44
 375/219
2015/0145618 A1 5/2015 Cho et al.

FOREIGN PATENT DOCUMENTS

| JP | 11-016737 A | 1/1999 |
| JP | 11-224817 A | 8/1999 |
| JP | 2002-329611 A | 11/2002 |
| JP | 2004-221153 A | 8/2004 |
| JP | 2004-363566 A | 12/2004 |
| JP | 2013-118298 A | 6/2013 |
| JP | 2015-103812 A | 6/2015 |
| WO | 2004/055841 A1 | 7/2004 |

* cited by examiner

PASSIVE ELEMENT ARRAY AND PRINTED WIRING BOARD

CROSS REFERENCE TO RELATED APPLICATIONS

This application claims the benefit of priority to Japanese Patent Application No. 2016-081477 filed on Apr. 14, 2016 and Japanese Patent Application No. 2016-093485 filed on May 6, 2016 and is a Continuation Application of PCT Application No. PCT/JP2017/014871 filed on Apr. 11, 2017. The entire contents of each application are hereby incorporated herein by reference.

BACKGROUND OF THE INVENTION

1. Field of the Invention

The present invention relates to a passive element array including a plurality of passive elements and a printed wiring board including the passive element array therein.

2. Description of the Related Art

Conventionally, passive element arrays of a chip type in which a plurality of passive elements are provided inside an element body that includes a plurality of laminated base material layers have been known.

As an example of passive element arrays of this type, a passive element array that includes three coil elements (passive elements) and three pairs of input/output terminals corresponding to the three coil elements is disclosed in Japanese Unexamined Patent Application Publication No. 8-250333. In the passive element array described in Japanese Unexamined Patent Application Publication No. 8-250333, the coil elements have different winding axes (coil axes), so that isolation between the coil elements can be ensured.

Furthermore, a passive element array that includes four coil elements and four pairs of input/output terminals corresponding to the four coil elements is disclosed in Japanese Unexamined Patent Application Publication No. 11-224817. In the passive element array described in Japanese Unexamined Patent Application Publication No. 11-224817, a magnetic shielding layer is provided between adjacent coil elements, so that isolation between the coil elements is able to be ensured.

However, with the passive element arrays described in Japanese Unexamined Patent Application Publication No. 8-250333 and Japanese Unexamined Patent Application Publication No. 11-224817, it is difficult to ensure isolation between input/output terminals for adjacent coil elements although isolation between coil elements is able to be ensured.

SUMMARY OF THE INVENTION

Preferred embodiments of the present invention provide passive element arrays that are each able to ensure isolation between input/output terminals connected to passive elements.

A passive element array according to a preferred embodiment of the present invention in a printed wiring board includes an element body that includes a plurality of laminated base material layers; a first passive element, a second passive element, and a third passive element that are provided at different positions in the element body when viewed from a lamination direction of the base material layers; a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body; a second input/output terminal that is connected to the other end of the first passive element, a fourth input/output terminal that is connected to the other end of the second passive element, and a sixth input/output terminal that is connected to the other end of the third passive element, the second input/output terminal, the fourth input/output terminal, and the sixth input/output terminal being provided at a second main surface of the element body; a ground terminal that is provided at the first main surface at least at one of a position between the first input/output terminal and the fifth input/output terminal, a position between the first input/output terminal and the third input/output terminal, and a position between the third input/output terminal and the fifth input/output terminal; and a ground terminal that is provided at the second main surface at least at one of a position between the second input/output terminal and the sixth input/output terminal, a position between the second input/output terminal and the fourth input/output terminal, and a position between the fourth input/output terminal and the sixth input/output terminal.

With this configuration, a ground terminal is provided at least at one of a position between the first input/output terminal, the third input/output terminal, and the fifth input/output terminal. Therefore, at the first main surface of the element body, isolation at least at a position between input/output terminals connected to the passive elements is ensured. Furthermore, a ground terminal is provided at least at one of a position between the second input/output terminal, the fourth input/output terminal, and the sixth input/output terminal. Therefore, at the second main surface of the element body, isolation at least at a position between input/output terminals connected to the passive elements is ensured.

Furthermore, the first passive element, the second passive element, and the third passive element may be arranged in order in a direction perpendicular or substantially perpendicular to the lamination direction, when viewed from the lamination direction. The ground terminal on the first main surface side may be provided between the first input/output terminal and the fifth input/output terminal. The ground terminal on the second main surface side may be provided between the second input/output terminal and the sixth input/output terminal.

With this configuration, a ground terminal is provided between the first input/output terminal and the fifth input/output terminal. Therefore, isolation between the first input/output terminal and the fifth input/output terminal is ensured. Furthermore, a ground terminal is provided between the second input/output terminal and the sixth input/output terminal. Therefore, isolation between the second input/output terminal and the sixth input/output terminal is ensured.

Furthermore, when the element body is viewed from the lamination direction, the first input/output terminal and the second input/output terminal may overlap the first passive element, the third input/output terminal and the fourth input/output terminal may overlap the second passive element, and the fifth input/output terminal and the sixth input/output terminal may overlap the third passive element.

With this configuration, a reduction in the size of the passive element array is achieved, and isolation between input/output terminals for passive elements is ensured.

Furthermore, when the element body is viewed from the lamination direction, at least one of the ground terminal on the first main surface side and the ground terminal on the second main surface side may overlap the second passive element.

With this configuration, a reduction in the size of the passive element array is achieved, and isolation between input/output terminals for passive elements is ensured.

Furthermore, the ground terminal on the first main surface side and the ground terminal on the second main surface side may be the third ground terminal and the fourth ground terminal, respectively. The passive element array may further include a first ground terminal and a fifth ground terminal that are provided at the first main surface, and a second ground terminal and a sixth ground terminal that are provided at the second main surface. When viewed from the lamination direction, at least one of the first ground terminal and the second ground terminal may overlap the first passive element, and at least one of the fifth ground terminal and the sixth ground terminal may overlap the third passive element.

With this configuration, a structure in which ground terminals are provided at both ends of the third input/output terminal is obtained. Therefore, for example, in the case in which the passive element array is provided in a printed wiring board, a situation in which an input/output signal to the third input/output terminal interferes with another signal is reduced or prevented. Furthermore, a structure in which ground terminals are provided at both ends of the fourth input/output terminal is obtained. Therefore, for example, in the case in which the passive element array is built in a printed wiring board, a situation in which an input/output signal to the fourth input/output terminal interferes with another signal is reduced or prevented.

Furthermore, the first ground terminal and the fifth ground terminal are provided at the first main surface of the element body, and the second ground terminal and the sixth ground terminal are provided at the second main surface of the element body. Therefore, uneven distribution of terminals provided at the first main surface and the second main surface is reduced, and deflection and distortion of the element body which may occur in the manufacturing process of the element body is reduced or prevented.

Furthermore, the first input/output terminal, the third input/output terminal, the fifth input/output terminal, the first ground terminal, the third ground terminal, and the fifth ground terminal may be arranged in a matrix shape at the first main surface, and the first input/output terminal, the third input/output terminal, and the fifth input/output terminal, and the first ground terminal, the third ground terminal, and the fifth ground terminal may be provided in order alternately along an arrangement direction in which the first passive element, the second passive element, and the third passive element are arranged, when viewed from the lamination direction. The second input/output terminal, the fourth input/output terminal, and the sixth input/output terminal, the second ground terminal, the fourth ground terminal, and the sixth ground terminal may be arranged in a matrix shape at the second main surface, and the second input/output terminal, the fourth input/output terminal, and the sixth input/output terminal, and the second ground terminal, the fourth ground terminal, and the sixth ground terminal may be provided in order alternately along the arrangement direction, when viewed from the lamination direction.

With this configuration, higher integration of the passive element array is achieved, isolation between the first input/output terminal and the fifth input/output terminal is ensured, and isolation between the second input/output terminal and the sixth input/output terminal is ensured.

Furthermore, the passive element array may further include a first facing electrode that faces the second ground terminal, a second facing electrode that faces the third ground terminal, and a third facing electrode that faces the sixth ground terminal, the first facing electrode, the second facing electrode, and the third facing electrode being provided in the element body. The first facing electrode may be connected to one end or the other end of the first passive element. The second facing electrode may be connected to one end or the other end of the second passive element. The third facing electrode may be connected to one end or the other end of the third passive element.

With this configuration, the second ground terminal and the first facing electrode, the third ground terminal and the second facing electrode, and the sixth ground terminal and the third facing electrode define three capacitors. Furthermore, each of the first passive element, the second passive element, and the third passive element is an inductor. Therefore, the passive element array that includes three LC filters is provided.

Furthermore, at least one of the first passive element, the second passive element, and the third passive element may be provided at a position different in the lamination direction from another passive element.

With this configuration, isolation at least at a position between two of the first passive element, the second passive element, and the third passive element is ensured.

Furthermore, the first passive element and the third passive element may be provided at positions closer to the first main surface than to the second main surface, and the second passive element may be provided at a position closer to the second main surface than to the first main surface.

With this configuration, isolation between the first passive element and the second passive element, and isolation between the second passive element and the third passive element are ensured.

Furthermore, each of the first passive element, the second passive element, and the third passive element may be an inductor.

With this configuration, isolation between input/output terminals for the first passive element, the second passive element, and the third passive element, which are inductors, is ensured. Therefore, electrical characteristics of each the inductors are stabilized.

A passive element array according to a preferred embodiment of the present invention, that is provided in a printed wiring board, includes an element body that includes a plurality of laminated base material layers; a first passive element, a second passive element, and a third passive element that are provided at different positions in the element body when viewed from a lamination direction of the base material layers; a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body; a second input/output terminal that is connected to the other end of the first passive element, a fourth input/output terminal that is connected to the other end of the second passive element, and a sixth input/output terminal that is connected to the other end of the third passive element, the second input/output terminal, the fourth input/output terminal, and the sixth input/output terminal being provided at a second main surface of the element body; a ground terminal that is provided at the first main surface at least at one of a position between the first input/output terminal and the fifth input/output terminal, a position between the first input/output terminal and the third input/output terminal, and a position between the third input/output terminal and the fifth input/output terminal; and a ground terminal that is provided at the second main surface at least at one of a position between the second input/output terminal and the sixth input/output terminal, a position between the second input/output terminal and the fourth input/output terminal, and a position between the fourth input/output terminal and the sixth input/output terminal. The terminal on the first main surface side is connected to a flexible wiring board or a flexible cable, and the terminal on the second main surface side is connected to the printed wiring board.

With this configuration, at least one ground terminal is provided on the first main surface side of the passive element array. Therefore, isolation in a region of the flexible wiring board or the flexible cable that is connected to the first main surface side is ensured. Furthermore, at least one ground terminal is provided on the second main surface side. Therefore, isolation in a region of the printed wiring board that is connected to the second main surface side is ensured.

Furthermore, a printed wiring board according to a preferred embodiment of the present invention including a passive element array provided therein, the passive element array including an element body that includes a plurality of laminated base material layers; a first passive element, a second passive element, and a third passive element that are provided at different positions in the element body when viewed from a lamination direction of the base material layers; a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body; a second input/output terminal that is connected to the other end of the first passive element, a fourth input/output terminal that is connected to the other end of the second passive element, and a sixth input/output terminal that is connected to the other end of the third passive element, the second input/output terminal, the fourth input/output terminal, and the sixth input/output terminal being provided at a second main surface of the element body; a ground terminal provided at the first main surface at least at one of a position between the first input/output terminal and the fifth input/output terminal, a position between the first input/output terminal and the third input/output terminal, and a position between the third input/output terminal and the fifth input/output terminal; and a ground terminal provided at the second main surface at least at one of a position between the second input/output terminal and the sixth input/output terminal, a position between the second input/output terminal and the fourth input/output terminal, and a position between the fourth input/output terminal and the sixth input/output terminal.

With this configuration, a printed wiring board in which a passive element array with isolation between input/output terminals being ensured is provided, is able to be provided.

A printed wiring board according to a preferred embodiment of the present invention including a passive element array provided therein, the passive element array including an element body that includes a plurality of laminated base material layers; a first passive element, a second passive element, and a third passive element that are provided at different positions in the element body when viewed from a lamination direction of the base material layers; a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body; a second input/output terminal that is connected to the other end of the first passive element, a fourth input/output terminal that is connected to the other end of the second passive element, and a sixth input/output terminal that is connected to the other end of the third passive element, the second input/output terminal, the fourth input/output terminal, and the sixth input/output terminal being provided at a second main surface of the element body; a ground terminal provided at the first main surface at least at one of a position between the first input/output terminal and the fifth input/output terminal, a position between the first input/output terminal and the third input/output terminal, and a position between the third input/output terminal and the fifth input/output terminal; and a ground terminal provided at the second main surface at least at one of a position between the second input/output terminal and the sixth input/output terminal, a position between the second input/output terminal and the fourth input/output terminal, and a position between the fourth input/output terminal and the sixth input/output terminal. The terminal on the first main surface side is connected to a flexible wiring board or a flexible cable, and the terminal on the second main surface side is connected to the printed wiring board.

With this printed wiring board, at least one ground terminal is provided on the first main surface side of the passive element array. Therefore, isolation in a region of the flexible wiring board or the flexible cable that is connected to the first main surface side is ensured. Furthermore, at least one ground terminal is provided on the second main surface side. Therefore, isolation in a region of the printed wiring board that is connected to the second main surface side is ensured.

According to preferred embodiments of the present invention, passive element arrays are provided that each ensure isolation between input/output terminals for passive elements.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
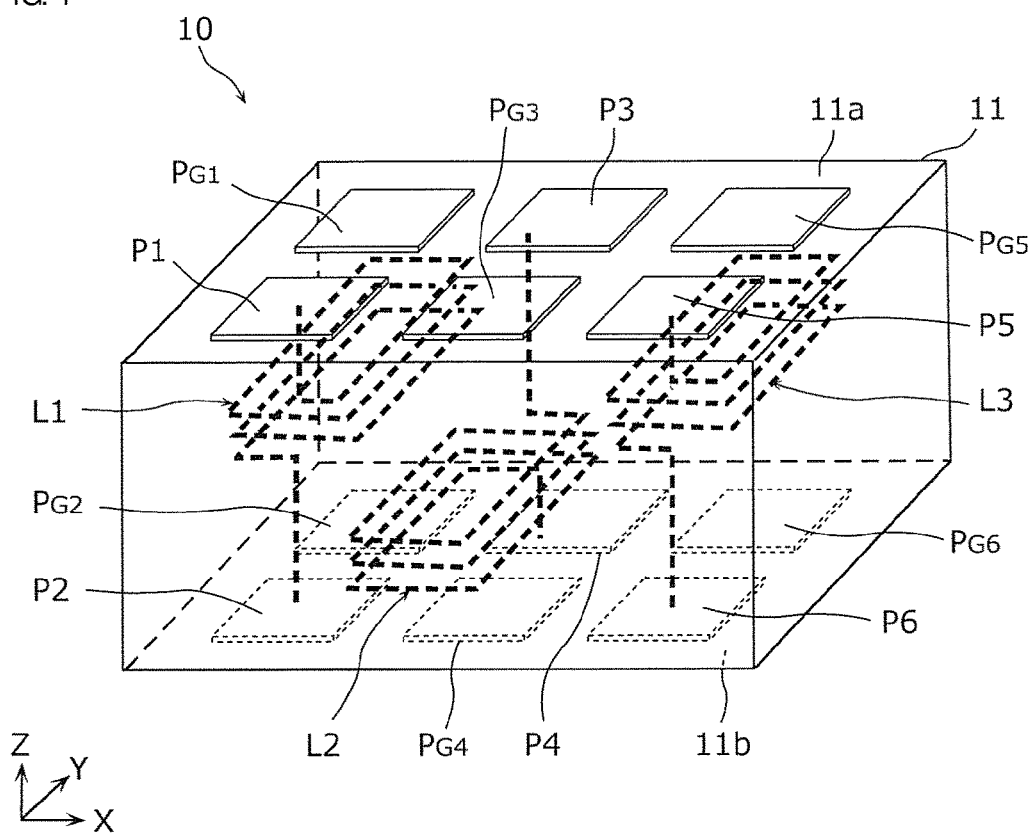
FIG. 1 is a schematic view of a passive element array according to a first preferred embodiment of the present invention.

Hereinafter, passive element arrays and printed wiring boards according to preferred embodiments of the present invention will be described with reference to drawings. The preferred embodiments described hereinafter each illustrate a preferred specific example of the present invention. Numerical values, shapes, materials, components, and arrangement and connection structures of the components, manufacturing steps, orders of manufacturing steps, and other elements and features illustrated in the preferred embodiments described below are merely examples, and are not intended to limit the present invention. Components in the preferred embodiments described below, except those described in any one of the independent claims defining the highest concept of the present invention, are optional components. The sizes or ratios between the sizes of the components illustrated in the drawings are not strictly correct. Furthermore, in each of the drawings, for the same or substantially the same configuration, the same reference signs will be provided, and redundant description will be omitted or simplified. In the preferred embodiments described below, "being connected" includes not only being directly connected but also being electrically connected with other elements interposed therebetween.

First Preferred Embodiment

A passive element array according to a first preferred embodiment of the present invention is a chip passive element array that is provided in a printed wiring board. Passive elements of the passive element array may be, for example, inductors, capacitors, resistors, and other suitable passive elements. In the present preferred embodiment, inductors will be described as an example of passive elements.

Figure 2A:
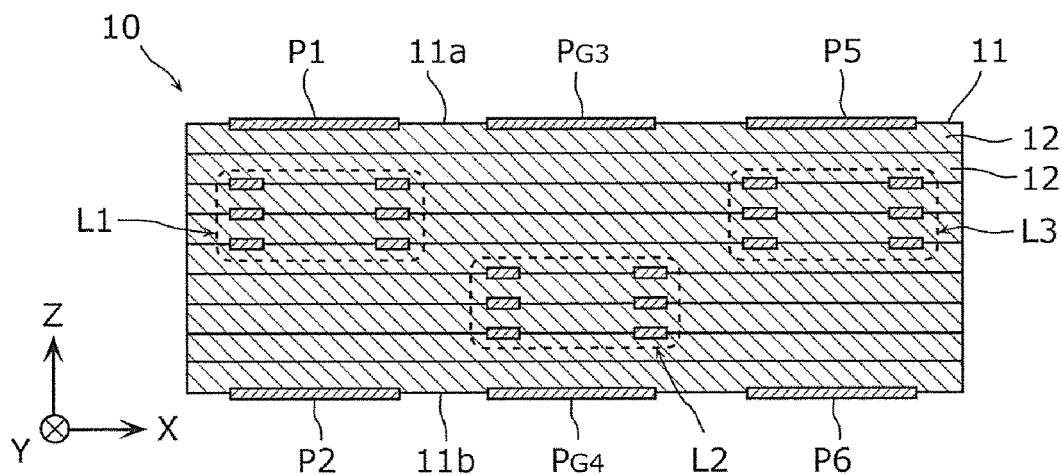
FIG. 2A is a cross-sectional schematic view of the passive element array according to the first preferred embodiment of the present invention when viewed from a Y direction.
Figure 2B:
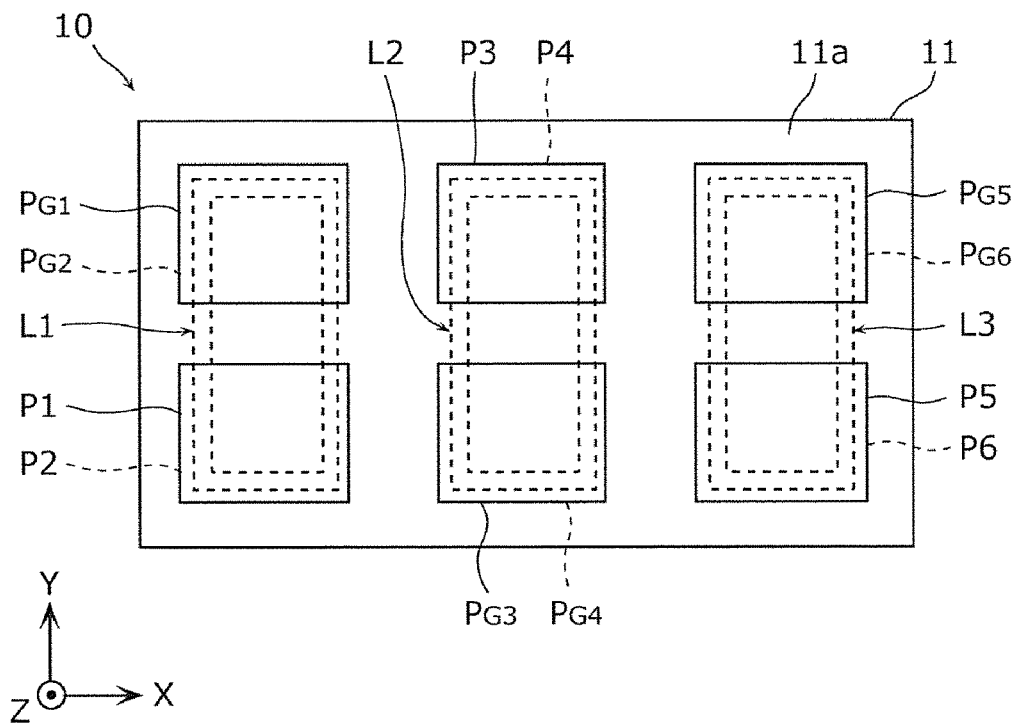
FIG. 2B is a diagram illustrating the passive element array according to the first preferred embodiment of the present invention when viewed from a lamination direction.
Figure 3:
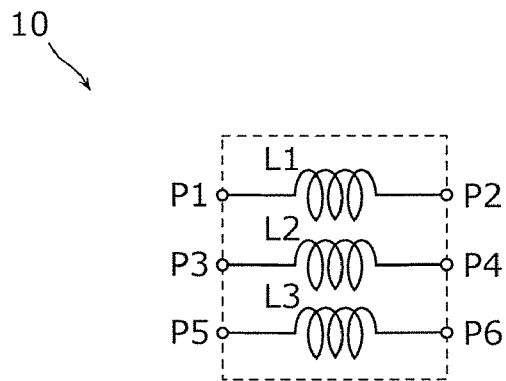
FIG. 3 is a diagram illustrating an equivalent circuit of the passive element array according to the first preferred embodiment of the present invention.

FIG. 1 is a schematic view of a passive element array 10 according to the first preferred embodiment. FIG. 2A is a cross-sectional schematic view of the passive element array 10 when viewed from a Y direction. FIG. 2B is a diagram illustrating the passive element array 10 when viewed from a lamination direction. FIG. 3 is a diagram illustrating an equivalent circuit of the passive element array 10.

First, a schematic configuration of the passive element array 10 according to the present preferred embodiment will be described.

The passive element array 10 includes, as illustrated in FIG. 1, FIGS. 2A and 2B, an element body 11 that includes a plurality of laminated base material layers 12, a first passive element L1, a second passive element L2, and a third passive element L3 that are provided in the element body 11. In FIGS. 2A and 2B, illustration of inter-layer conductors (via conductors) included in the passive elements L1, L2, and L3 and lead-out conductors is omitted.

The passive element array 10 also includes a first input/output terminal P1 and a second input/output terminal P2 that are connected to the first passive element L1, a third input/output terminal P3 and a fourth input/output terminal P4 that are connected to the second passive element L2, and a fifth input/output terminal P5 and a sixth input/output terminal P6 that are connected to the third passive element L3.

Furthermore, the passive element array 10 includes a first ground terminal $P_{G1}$ and a second ground terminal $P_{G2}$ that correspond to the first passive element L1, a third ground terminal $P_{G3}$ and a fourth ground terminal $P_{G4}$ that corresponds to the second passive element L2, and a fifth ground terminal $P_{G5}$ and a sixth ground terminal $P_{G6}$ that correspond to the third passive element L3.

The passive element array 10 preferably includes, as illustrated in FIG. 3, three coil elements, for example.

Specifically, the passive element array 10 is structured such that a first passive element unit including a set of the passive element L1, the input/output terminals P1 and P2, and the ground terminals $P_{G1}$ and $P_{G2}$, a second passive element unit including a set of the passive element L2, the input/output terminals P3 and P4, and the ground terminals $P_{G3}$ and $P_{G4}$, and a third passive element unit including a set of the passive element L3, the input/output terminals P5 and P6, and the ground terminals $P_{G5}$ and $P_{G6}$ are sequentially provided.

Hereinafter, a direction in which the plurality of base material layers 12 are laminated will be referred to as a lamination direction Z, a direction that is perpendicular or substantially perpendicular to the lamination direction Z and in which the first passive element L1 and the second passive element L2 are provided in line will be referred to as an X direction (arrangement direction), and a direction that is perpendicular or substantially perpendicular to both of the lamination direction Z and the X direction will be referred to as a Y direction. Furthermore, in each of the directions, a direction along an arrow will be referred to as a positive direction, and a direction opposite an arrow will be referred to as a negative direction.

The element body 11 preferably has a rectangular or substantially rectangular parallelepiped shape and includes a first main surface 11a that is perpendicular or substantially perpendicular to the axis of the lamination direction Z and a second main surface 11b that is opposite the first main surface 11a.

The first input/output terminal P1, the third input/output terminal P3, the fifth input/output terminal P5, the first ground terminal $P_{G1}$, the third ground terminal $P_{G3}$, and the fifth ground terminal $P_{G5}$ that preferably have the same or substantially the same square shape, for example, are provided in a matrix shape at the first main surface 11a of the element body 11. The second input/output terminal P2, the fourth input/output terminal P4, the sixth input/output terminal P6, the second ground terminal $P_{G2}$, the fourth ground terminal $P_{G4}$, and the sixth ground terminal $P_{G6}$ that preferably have the same or substantially the same square shape, for example, are provided in a matrix shape at the second main surface 11b of the element body 11.

The plurality of input/output terminals P1, P3, and P5 at the first main surface 11a are disposed in a zig-zag pattern along the X direction. Furthermore, the plurality of ground terminals $P_{G1}$, $P_{G3}$, and $P_{G5}$ at the first main surface 11a are disposed, along the X direction, in a zig-zag pattern so as to be opposite the zig-zag pattern of the plurality of input/output terminals P1, P3, and P5. That is, the plurality of input/output terminals P1, P3, and P5 and the plurality of ground terminals $P_{G1}$, $P_{G3}$, and $P_{G5}$ are alternately disposed with one another along the X direction, when viewed from the lamination direction.

The plurality of input/output terminals P2, P4, and P6 at the second main surface 11b are disposed in a zig-zag pattern along the X direction. Furthermore, the plurality of ground terminals $P_{G2}$, $P_{G4}$, and $P_{G6}$ at the second main surface 11b are disposed, along the X direction, in a zig-zag pattern so as to be opposite the zig-zag pattern of the plurality of input/output terminals P2, P4, and P6. That is, the plurality of input/output terminals P2, P4, and P6 and the plurality of ground terminals $P_{G2}$, $P_{G4}$, and $P_{G6}$ are alternately disposed with one another along the X direction, when viewed from the lamination direction.

In the passive element array 10, the third ground terminal $P_{G3}$ is provided between the first input/output terminal P1 and the fifth input/output terminal P5 at the first main surface 11a of the element body 11. By providing the ground terminal $P_{G3}$ between the first input/output terminal P1 and the fifth input/output terminal P5 as described above, isolation between the first input/output terminal P1 and the fifth input/output terminal P5 is ensured.

Furthermore, in the passive element array 10, the fourth ground terminal $P_{G4}$ is provided between the second input/output terminal P2 and the sixth input/output terminal P6 at the second main surface 11b of the element body 11. By providing the ground terminal $P_{G4}$ between the second input/output terminal P2 and the sixth input/output terminal P6 as described above, isolation between the second input/output terminal P2 and the sixth input/output terminal P6 is ensured.

The element body 11 is preferably, for example, a magnetic body, such as magnetic ferrite ceramics. That is, each of the base material layers 12 is preferably a magnetic layer. Specifically, as a material of the element body 11, for example, ferrite including iron oxide as a main component and at least one or more of zinc, nickel, and copper as an accessory component is preferably used. Furthermore, as a material of the element body 11, for example, a material having electrical characteristics (magnetic permeability, permittivity, and other characteristics) different from those of a substrate material of a printed wiring board is preferably used.

Furthermore, as a material of the passive elements L1 to L3, the input/output terminals P1 to P6, and the ground terminals $P_{G1}$ to $P_{G6}$, for example, metal or an alloy including silver as a main component is preferably used. Furthermore, for example, plating of nickel, palladium, or gold may be used for the material of the input/output terminals P1 to P6 and the ground terminals $P_{G1}$ to $P_{G6}$.

Next, details of the passive element array 10 will be described in the order in which passive element units are disposed.

The first passive element L1 is preferably a coil element that includes a winding axis in the Z direction and has a rectangular or substantially rectangular outer shape when viewed from the winding axis direction and is a helical coil element defined by connecting coil patterns provided in the plurality of base material layers 12 with inter-layer conductors interposed therebetween. The first passive element L1, which is a coil element, includes a short side in the X direction and a long side in the Y direction. The coil axis of the first passive element L1 is parallel or substantially parallel to the axis of the lamination direction Z. Furthermore, the first passive element L1 is provided at a position closer to the first main surface 11a than to the second main surface 11b of the element body 11.

The first input/output terminal P1 is a plane electrode terminal (that is, an LGA (Land Grid Array) electrode terminal) provided only at the first main surface 11a of the element body 11. The second input/output terminal P2 is a plane electrode terminal provided only at the second main surface 11b of the element body 11. The first input/output terminal P1 is connected to one end of the first passive element L1, and the second input/output terminal P2 is connected to the other end of the first passive element L1.

The first input/output terminal P1 and the second input/output terminal P2 face each other in the lamination direction Z. As illustrated in FIG. 2B, each of the first input/output terminal P1 and the second input/output terminal P2 overlaps the first passive element L1 when viewed from the lamination direction Z.

The first ground terminal $P_{G1}$ is a plane electrode terminal provided only on the first main surface 11a side of the element body 11. The first ground terminal $P_{G1}$ is spaced apart from the first input/output terminal P1 in the positive Y direction. The second ground terminal $P_{G2}$ is a plane electrode terminal provided only on the second main surface 11b side of the element body 11. The second ground terminal $P_{G2}$ is spaced from the second input/output terminal P2 in the positive Y direction.

The first ground terminal $P_{G1}$ and the second ground terminal $P_{G2}$ face each other in the lamination direction Z. As illustrated in FIG. 2B, each of the first ground terminal $P_{G1}$ and the second ground terminal $P_{G2}$ overlaps the first passive element L1 when viewed from the lamination direction Z.

The second passive element L2 is provided at a position different from the first passive element L1 when viewed from the lamination direction Z. Specifically, the first passive element L1 and the second passive element L2 are adjacent to each other in the X direction.

The second passive element L2 is a coil element that preferably includes a winding axis in the Z direction and has a rectangular or substantially rectangular outer shape when viewed from the winding axis direction and is a helical coil element defined by connecting coil patterns provided in the plurality of base material layers 12 with inter-layer conductors interposed therebetween. The second passive element L2, which is a coil element, includes a short side in the X direction and a long side in the Y direction. The coil axis of the second passive element L2 is parallel or substantially parallel to the axis of the lamination direction Z. That is, the coil axis of the first passive element L1 and the coil axis of the second passive element L2 are parallel or substantially parallel to each other. In FIG. 1, the coil winding direction of the second passive element L2 is the same as the coil winding direction of the first passive element L1.

Furthermore, the second passive element L2 is disposed closer to the second main surface 11b than to the first main surface 11a of the element body 11 and is displaced with respect to the first passive element L1 by a specific distance in the lamination direction Z. Specifically, the first passive element L1 and the second passive element L2 are provided at different positions in the lamination direction Z (at different base material layers 12) and do not overlap when viewed from the X direction.

The third input/output terminal P3 is a plane electrode terminal provided only at the first main surface 11a of the element body 11. The third input/output terminal P3 is spaced apart from the first input/output terminal P1 in a direction between the positive X direction and the positive Y direction. The fourth input/output terminal P4 is a plane electrode terminal provided only at the second main surface 11b of the element body 11. The fourth input/output terminal P4 is spaced apart from the second input/output terminal P2 in a direction between the positive X direction and the positive Y direction. The third input/output terminal P3 is connected to one end of the second passive element L2, and the fourth input/output terminal P4 is connected to the other end of the second passive element L2.

The third input/output terminal P3 and the fourth input/output terminal P4 face each other in the lamination direction Z. As illustrated in FIG. 2B, each of the third input/output terminal P3 and the fourth input/output terminal P4 overlaps the second passive element L2 when viewed from the lamination direction Z.

The third ground terminal $P_{G3}$ is a plane electrode terminal provided only on the first main surface 11a side of the element body 11. The third ground terminal $P_{G3}$ is spaced apart from the third input/output terminal P3 in a negative Y direction. The fourth ground terminal $P_{G4}$ is a plane electrode terminal provided only on the other main surface 11b side of the element body 11. The fourth ground terminal $P_{G4}$ is spaced apart from the fourth input/output terminal P4 in the negative Y direction.

The third ground terminal $P_{G3}$ and the fourth ground terminal $P_{G4}$ face each other in the lamination direction Z. As illustrated in FIG. 2B, each of the third ground terminal $P_{G3}$ and the fourth ground terminal $P_{G4}$ overlaps the second passive element L2 when viewed from the lamination direction Z.

The third passive element L3 is provided opposite the first passive element L1 relative to the second passive element L2, along the X direction (arrangement direction) in which the first passive element L1 and the second passive element L2 are disposed. That is, the first passive element L1, the second passive element L2, and the third passive element L3 are disposed in order along the X direction.

The third passive element L3 is preferably a coil element having a rectangular or substantially rectangular outer shape, for example. The third passive element L3 includes a short side in the X direction and a long side in the Y direction, and the coil axis of the third passive element L3 is parallel or substantially parallel to the axis of the lamination direction Z. That is, the coil axes of the first passive element L1, the second passive element L2 and the third passive element L3 are parallel or substantially parallel to one another. The coil winding direction of the third passive element L3 is the same as the coil winding direction of the first passive element L1.

Furthermore, the third passive element L3 is disposed at a position closer to the first main surface 11a than to the second main surface 11b of the element body 11 and displaced with respect to the second passive element L2 by a specific distance in the lamination direction Z. Specifically, the third passive element L3 overlaps the first passive element L1 but does not overlap the second passive element L2 when viewed from the X direction.

The fifth input/output terminal P5 is a plane electrode terminal provided only at the first main surface 11a of the element body 11. The fifth input/output terminal P5 is spaced apart from the third input/output terminal P3 in a direction between the positive X direction and the negative Y direction. The sixth input/output terminal P6 is a plane electrode terminal provided only at the second main surface 11b of the element body 11. The sixth input/output terminal P6 is spaced apart from the fourth input/output terminal P4 in a direction between the positive X direction and the negative Y direction. The fifth input/output terminal P5 is connected to one end of the third passive element L3, and the sixth input/output terminal P6 is connected to the other end of the third passive element L3.

The fifth input/output terminal P5 and the sixth input/output terminal P6 face each other in the lamination direction Z. As illustrated in FIG. 2B, each of the fifth input/output terminal P5 and the sixth input/output terminal P6 overlaps the third passive element L3 when viewed from the lamination direction Z.

The fifth ground terminal $P_{G5}$ is a plane electrode terminal provided only on the first main surface 11a side of the element body 11. The fifth ground terminal $P_{G5}$ is spaced apart from the fifth input/output terminal P5 in the positive Y direction. The sixth ground terminal $P_{G6}$ is a plane electrode terminal provided only on the second main surface 11b side of the element body 11. The sixth ground terminal $P_{G6}$ is spaced apart from the sixth input/output terminal P6 in the positive Y direction.

The fifth ground terminal $P_{G5}$ and the sixth ground terminal $P_{G6}$ face each other in the lamination direction Z. As illustrated in FIG. 2B, each of the fifth ground terminal $P_{G5}$ and the sixth ground terminal $P_{G6}$ overlaps the third passive element L3 when viewed from the lamination direction Z.

Next, non-limiting examples of manufacturing steps of the passive element array 10 will be described.

First, a plurality of green sheets, from which the base material layers 12 are to be made, are prepared. Specifically, magnetic green sheets are prepared by sheet-molding slurry including magnetic ceramic powder.

Next, a plurality of through-holes are formed in a specific green sheet. Then, conductive paste is filled in the through-holes to form a plurality of via conductors, and the conductive paste is applied to the green sheet with specific patterns. Accordingly, a first coil pattern and a third coil pattern each having a loop shape forming the first passive element L1 and the third passive element L3 are formed. Furthermore, a plurality of through-holes are formed in a different green sheet. Then, conductive paste is filled in the plurality of through-holes to form a plurality of via conductors, and the conductive paste is applied to the green sheet with a specific pattern. Accordingly, a second coil pattern having a loop shape forming the second passive element L2 is formed. Through-holes are formed by, for example, laser machining.

Furthermore, via conductors are formed in a green sheet defining one of outermost layers, and conductive paste is applied to the green sheet with specific patterns to form a first input/output pattern, a third input/output pattern, a fifth input/output pattern, a first ground pattern, a third ground pattern, and a fifth ground pattern. Furthermore, via conductors are formed in a green sheet defining the other one of the outermost layers, and a second input/output pattern, a fourth input/output pattern, a sixth input/output pattern, a second ground pattern, a fourth ground pattern, and a sixth ground pattern are formed.

The coil patterns, input/output patterns, and ground patterns are preferably formed by screen-printing with conductive paste including, for example, Ag powder. The input/output patterns and the ground patterns may be formed by a thin film forming method, such as sputtering after firing, for example, instead of a printing method.

Next, the plurality of green sheets in which the coil patterns, the input/output patterns, the ground patterns, and the like are formed are laminated and pressure-bonded, and then fragmented. After that, they are collectively fired. As a result of the firing, the magnetic ceramic powder in each of the green sheets is sintered, and the Ag powder in the conductive paste is sintered. By the above steps, the passive element array 10 is manufactured.

As described above, the passive element array 10 according to the present preferred embodiment includes the element body 11 including the plurality of laminated base material layers 12, the first passive element L1, the second passive element L2, and the third passive element L3 that are provided at different positions in the element body 11 when viewed from the lamination direction Z of the base material layers 12, the first input/output terminal P1 connected to one end of the first passive element L1, the third input/output terminal P3 connected to one end of the second passive element L2, and the fifth input/output terminal P5 connected to one end of the third passive element L3, the first input/output terminal P1, the third input/output terminal P3, and the fifth input/output terminal P5 being provided at the first main surface 11a of the element body 11, the second input/output terminal P2 connected to the second end of the first passive element L1, the fourth input/output terminal P4 connected to the other end of the second passive element L2, the sixth input/output terminal P6 connected to the other end of the third passive element L3, the second input/output terminal P2, the fourth input/output terminal P4, and the sixth input/output terminal P6 being provided at the other main surface 11b of the element body 11, the third ground terminal $P_{G3}$ provided between the first input/output terminal P1 and the fifth input/output terminal P5 at the first main surface 11a, and the fourth ground terminal $P_{G4}$ provided between the second input/output terminal P2 and the sixth input/output terminal P6 at the second main surface 11b.

As described above, by providing the third ground terminal $P_{G3}$ between the first input/output terminal P1 and the fifth input/output terminal P5, isolation between the first input/output terminal P1 and the fifth input/output terminal P5 is ensured. Furthermore, by providing the fourth ground terminal $P_{G4}$ between the second input/output terminal P2 and the sixth input/output terminal P6, isolation between the second input/output terminal P2 and the sixth input/output terminal P6 is ensured.

In the present preferred embodiment, the other end of the passive element L1 is connected to the second input/output terminal P2, the other end of the passive element L2 is connected to the fourth input/output terminal P4, and the other end of the passive element L3 is connected to the sixth input/output terminal P6. However, the connection structure at the second main surface 11b of the element body 11 is not limited to that described above. For example, the positions of the second input/output terminals P2 and P4 may be exchanged, the other ends of the passive elements L1 and L2 may be connected to the input/output terminals P2 and P4, respectively, and the ground terminal $P_{G4}$ may be provided between the input/output terminals P4 and P6. Furthermore, the positions of the input/output terminals P4 and P6 may be exchanged, the other ends of the passive elements L2 and L3 may be connected to the input/output terminals P4 and P6, respectively, and the ground terminal $P_{G4}$ may be provided between the input/output terminals P2 and P4.

That is, in the passive element array 10 according to the present preferred embodiment, a ground terminal on the second main surface 11b side may be provided at least at one of the position between the second input/output terminal P2 and the sixth input/output terminal P6, the position between the second input/output terminal P2 and the fourth input/output terminal P4, and the position between the fourth input/output terminal P4 and the sixth input/output terminal P6.

Similarly, in the present preferred embodiment, one end of the passive element L1 is connected to the input/output terminal P1, one end of the passive element L2 is connected to the input/output terminal P3, and one end of the passive element L3 is connected to the input/output terminal P5. However, the connection structure at the first main surface 11a of the element body 11 is not limited to the above. For example, the positions of the input/output terminals P1 and P3 may be exchanged, one ends of the passive elements L1 and L2 may be connected to the input/output terminals P1 and P3, respectively, and the ground terminal $P_{G3}$ may be provided between the input/output terminals P3 and P5. Furthermore, the positions of the input/output terminals P3 and P5 may be exchanged, one ends of the passive elements L2 and L3 may be connected to the input/output terminals P3 and P5, respectively, and the ground terminal $P_{G3}$ may be provided between the input/output terminals P1 and P3.

That is, in the passive element array 10 according to the present preferred embodiment, a ground terminal on the first main surface 11a side may be provided at least at one of the position between the first input/output terminal P1 and the fifth input/output terminal P5, the position between the first input/output terminal P1 and the third input/output terminal P3, and the position between the third input/output terminal P3 and the fifth input/output terminal P5.

Furthermore, in the present preferred embodiment, the third ground terminal $P_{G3}$ extends entirely in between the first input/output terminal P1 and the fifth input/output terminal P5. However, the third ground terminal $P_{G3}$ is not necessarily provided as described above. The third ground terminal $P_{G3}$ may enter a portion of a region between the first input/output terminal P1 and the fifth input/output terminal P5. That is, the third ground terminal $P_{G3}$ may overlap with a portion of the first input/output terminal P1 and a portion of the fifth input/output terminal P5 when viewed from the X direction.

Similarly, in the present preferred embodiment, the fourth ground terminal $P_{G4}$ extends entirely in between the second input/output terminal P2 and the sixth input/output terminal P6. However, the fourth ground terminal $P_{G4}$ is not necessarily provided as described above. The fourth ground terminal $P_{G4}$ may enter a portion of a region between the second input/output terminal P2 and the sixth input/output terminal P6. That is, the fourth ground terminal $P_{G4}$ may overlap with a portion of the second input/output terminal P2 and a portion of the sixth input/output terminal P6 when viewed from the X direction.

Furthermore, in the present preferred embodiment, each of the first ground terminal $P_{G1}$ and the third ground terminal $P_{G3}$ enters a portion of a region between the first input/output terminal P1 and the third input/output terminal P3 that are adjacent to each other in the direction between the positive X direction and the positive Y direction. With this structure, signal interference between the first input/output terminal P1 and the third input/output terminal P3 is reduced.

Furthermore, each of the third ground terminal $P_{G3}$ and the fifth ground terminal $P_{G5}$ enters a portion of a region between the third input/output terminal P3 and the fifth input/output terminal P5 that are adjacent to each other in the direction between the positive X direction and the negative Y direction. With this structure, signal interference between the third input/output terminal P3 and the fifth input/output terminal P5 is reduced.

Similarly, each of the second ground terminal $P_{G2}$ and the fourth ground terminal $P_{G4}$ enters a portion of a region between the second input/output terminal P2 and the fourth input/output terminal P4 that are adjacent to each other in the direction between the positive X direction and the positive Y direction. With this structure, signal interference between the second input/output terminal P2 and the fourth input/output terminal P4 is reduced.

Furthermore, each of the fourth ground terminal $P_{G4}$ and the sixth ground terminal $P_{G6}$ enters a portion of a region between the fourth input/output terminal P4 and the sixth input/output terminal P6 that are adjacent to each other in the direction between the positive X direction and the negative Y direction. With this structure, signal interference between the fourth input/output terminal P4 and the sixth input/output terminal P6 is reduced.

Next, a case in which the passive element array 10 is provided in a printed wiring board will be explained.

Figure 4:
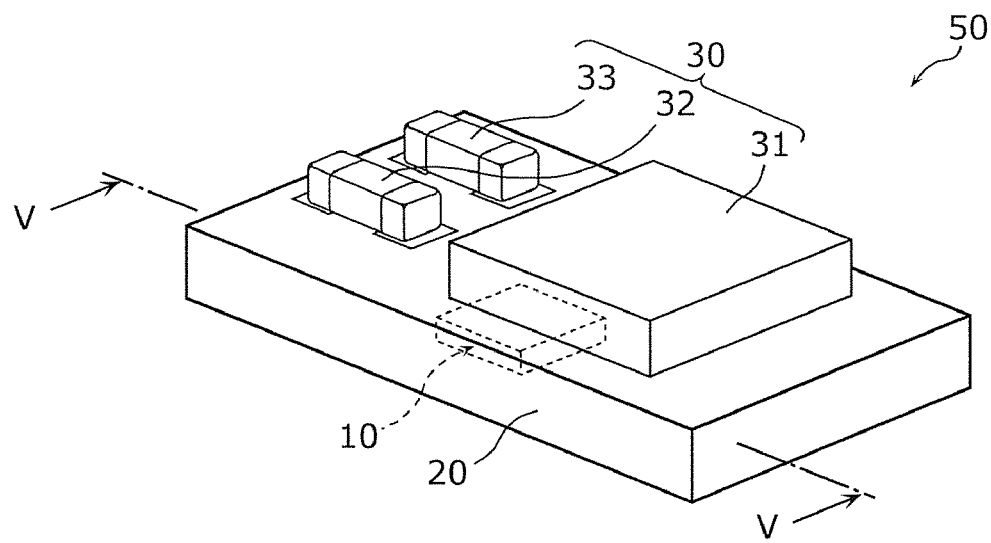
FIG. 4 is a perspective view of a printed wiring board in which the passive element array according to the first preferred embodiment of the present invention is provided.
Figure 4:
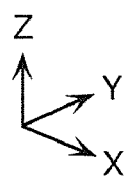
Figure 5:
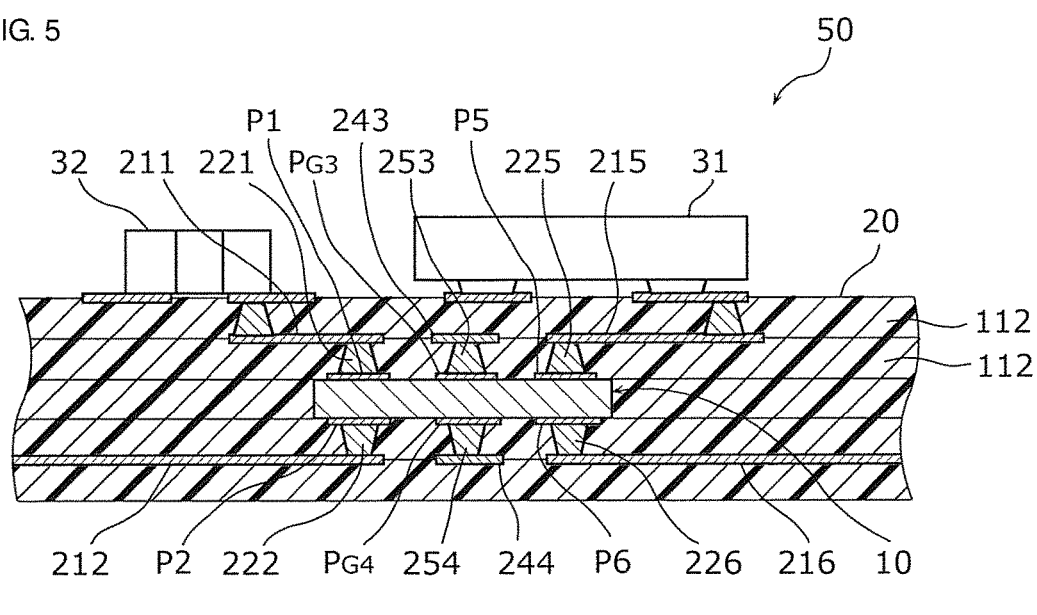
FIG. 5 is a schematic view of the printed wiring board according to the first preferred embodiment of the present invention taken along line V-V of FIG. 4.

FIG. 4 is a perspective view of a printed wiring board 20 in which the passive element array 10 is provided. FIG. 5 is a schematic view of the printed wiring board 20 taken along line V-V of FIG. 4.

The printed wiring board 20 according to the present preferred embodiment is preferably used as, for example, a substrate of a high-frequency module 50. The high-frequency module 50 is, for example, a DC-DC converter and includes, as illustrated in FIG. 4 and FIG. 5, the printed wiring board 20 in which the passive element array 10 is provided and mount components 30 (e.g., a switching IC 31, chip capacitors 32 and 33, and other suitable components) mounted on the printed wiring board 20. The switching IC 31 performs switching of a voltage input to an input terminal and outputs the voltage through an output terminal. The chip capacitors 32 and 33 are smoothing capacitors on an input side and an output side. One of coil elements of the passive element array 10 defines and functions as a choke coil.

The printed wiring board 20 is a circuit substrate on which various electronic components are mounted and includes wiring patterns connecting the electronic components. For example, the printed wiring board 20 is formed by laminating and pressure-bonding a plurality of resin base material layers 112. As a material of the resin base material layers 112, for example, a thermoplastic resin sheet made of liquid crystal polymer (LCP) or polyimide is preferably used. Various conductors, such as an in-plane conductor, an inter-layer conductor, and a surface conductor, are provided at the printed wiring board 20. The entire passive element array 10 is embedded in the printed wiring board 20 and is connected to the mount components 30 with the various conductors described above interposed therebetween. The printed wiring board 20 is not limited to a multilayer body including the resin base material layers 112. The printed wiring board 20 may be a multilayer body including base materials made of a material with a low magnetic permeability than a magnetic material.

Next, a connection structure of input/output terminals and ground terminals of the passive element array 10 in the printed wiring board 20 will be explained.

Figure 6A:
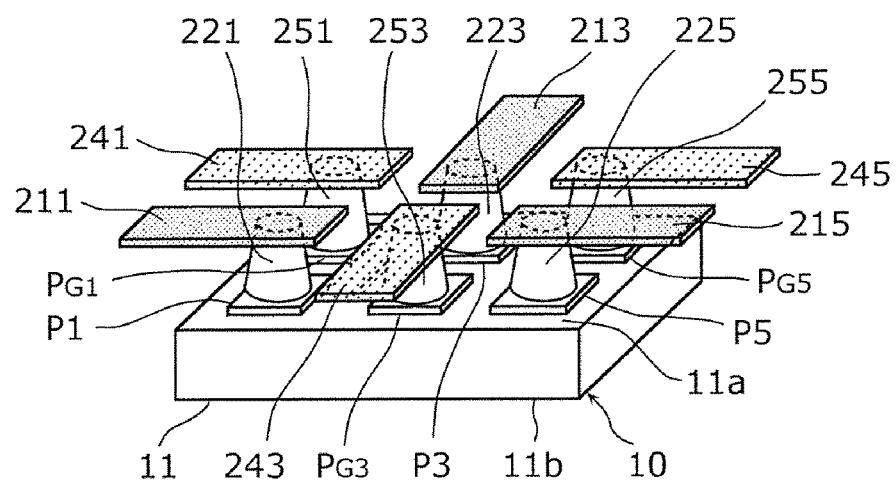
FIG. 6A is a diagram illustrating a connection structure at a first main surface of the passive element array in the printed wiring board according to the first preferred embodiment of the present invention.
Figure 6A:
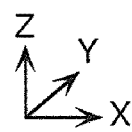
Figure 6B:
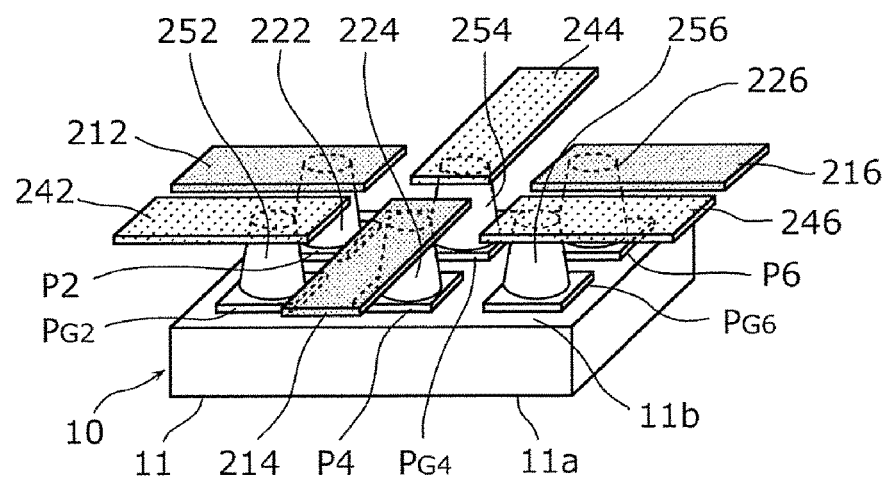
FIG. 6B is a diagram illustrating a connection structure at a second main surface of the passive element array in the printed wiring board according to the first preferred embodiment of the present invention.
Figure 6B:
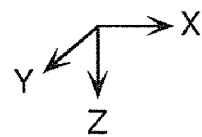

FIG. 6A is a diagram illustrating a connection structure at the first main surface 11a of the passive element array 10 provided in the printed wiring board 20. FIG. 6B is a diagram illustrating a connection structure at the second main surface 11b of the passive element array 10 provided in the printed wiring board 20.

As illustrated in FIG. 6A, on the first main surface 11a side of the passive element array 10, the first input/output terminal P1 is connected to a signal line 211 with an inter-layer conductor 221 interposed therebetween, the third input/output terminal P3 is connected to a signal line 213 with an inter-layer conductor 223 interposed therebetween, and the fifth input/output terminal P5 is connected to a signal line 215 with an inter-layer conductor 225 interposed therebetween. The signal line 211 is led out in the negative X direction, the signal line 213 is led out in the positive Y direction, and the signal line 215 is led out in the positive X direction. The signal line 211, the signal line 213, and the signal line 215 are connected to corresponding specific mount components 30.

Furthermore, the third ground terminal $P_{G3}$ is connected to a ground line 243 with an inter-layer conductor 253 therebetween. The ground line 243 is led out in the negative Y direction and is connected to ground electrodes provided over the entire or substantially the entire printed wiring board 20.

In the present preferred embodiment, the passive element array 10 includes the third ground terminal $P_{G3}$ between the first input/output terminal P1 and the fifth input/output terminal P5. Therefore, in the case in which the passive element array 10 is provided in the printed wiring board 20, a structure in which the ground line 243 is disposed between the signal line 211 and the signal line 215 is obtained. Accordingly, in the printed wiring board 20, isolation between the signal line 211 and the signal line 215 is ensured.

Furthermore, as illustrated in FIG. 6A, the first ground terminal $P_{G1}$ is connected to a ground line 241 with an inter-layer conductor 251 interposed therebetween, and the fifth ground terminal $P_{G5}$ is connected to a ground line 245 with an inter-layer conductor 255 interposed therebetween. The ground line 241 is led out in the negative Y direction, and the ground line 245 is led out in the positive Y direction. The ground line 241 and the ground line 245 are connected to ground electrodes provided over the entire or substantially the entire printed wiring board 20.

The passive element array 10 according to the present preferred embodiment includes the first ground terminal $P_{G1}$ in the negative X direction of the third input/output terminal P3 and includes the fifth ground terminal $P_{G5}$ in the positive X direction of the third input/output terminal P3. Therefore, in the case in which the passive element array 10 is provided in the printed wiring board 20, a structure in which the signal line 213 near the passive element array 10 is sandwiched between the ground line 241 and the ground line 245 is obtained. With this structure, interference between a signal in the signal line 213 and a signal in another signal line in the second printed wiring board 20 is reduced or prevented.

Furthermore, as illustrated in FIG. 6B, on the second main surface 11b side of the passive element array 10, the second input/output terminal P2 is connected to a signal line 212 with an inter-layer conductor 222 interposed therebetween, the fourth input/output terminal P4 is connected to a signal line 214 with an inter-layer conductor 224 interposed therebetween, and the sixth input/output terminal P6 is connected to a signal line 216 with an inter-layer conductor 226 interposed therebetween. The signal line 212 is led out in the negative X direction, the signal line 214 is led out in the positive Y direction, and the signal line 216 is led out in the positive X direction. The signal line 212, the signal line 214, and the signal line 216 are connected to corresponding mount components 30.

Furthermore, the fourth ground terminal $P_{G4}$ is connected to a ground line 244 with an inter-layer conductor 254 interposed therebetween. The ground line 244 is led out in the negative Y direction and is connected to ground electrodes provided over the entire or substantially the entire printed wiring board 20.

The passive element array 10 according to the present preferred embodiment includes the fourth ground terminal $P_{G4}$ between the second input/output terminal P2 and the sixth input/output terminal P6. Therefore, in the case in which the passive element array 10 is provided in the printed wiring board 20, a structure in which the ground line 244 is disposed between the signal line 212 and the signal line 216 is obtained. Accordingly, in the printed wiring board 20, isolation between the signal line 212 and the signal line 216 is ensured.

Furthermore, as illustrated in FIG. 6B, the second ground terminal $P_{G2}$ is connected to a ground line 242 with an inter-layer conductor 252 interposed therebetween, and the sixth ground terminal $P_{G6}$ is connected to a ground line 246 with an inter-layer conductor 256 interposed therebetween. The ground line 242 is led out in the negative Y direction, and the ground line 246 is led out in the positive Y direction. The ground line 242 and the ground line 246 are connected to ground electrodes provided over the entire or substantially the entire printed wiring board 20.

The passive element array 10 according to the present preferred embodiment includes the second ground terminal $P_{G2}$ in the negative X direction of the fourth input/output terminal P4 and includes the sixth ground terminal $P_{G6}$ in the positive X direction of the fourth input/output terminal P4. Therefore, in the case in which the passive element array 10 is provided in the printed wiring board 20, a structure in which the signal line 214 near the passive element array 10 is sandwiched between the ground line 242 and the ground line 246 is obtained. With this structure, interference between a signal in the signal line 214 and a signal in another signal line in the printed wiring board 20 is reduced or prevented.

Second Preferred Embodiment

A passive element array 10A according to a second preferred embodiment of the present invention is different from the passive element array 10 according to the first preferred embodiment in the arrangement of input/output terminals and ground terminals at the second main surface 11b of the element body 11.

Figure 7:
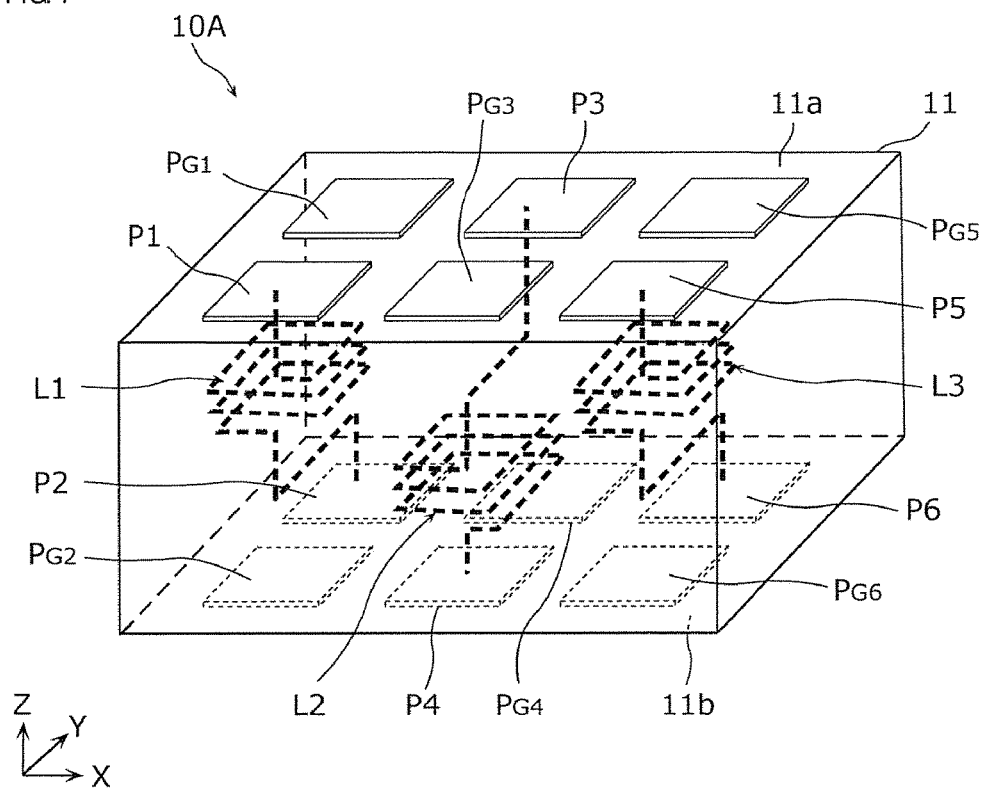
FIG. 7 is a schematic view of a passive element array according to a second preferred embodiment of the present invention.
Figure 8A:
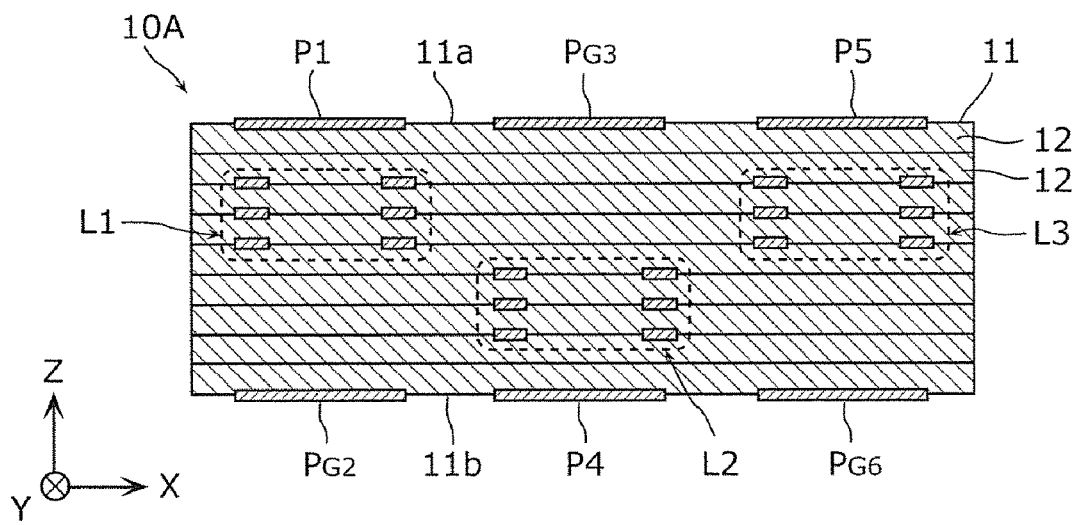
FIG. 8A is a cross-sectional schematic view of the passive element array according to the second preferred embodiment of the present invention when viewed from a Y direction.
Figure 8B:
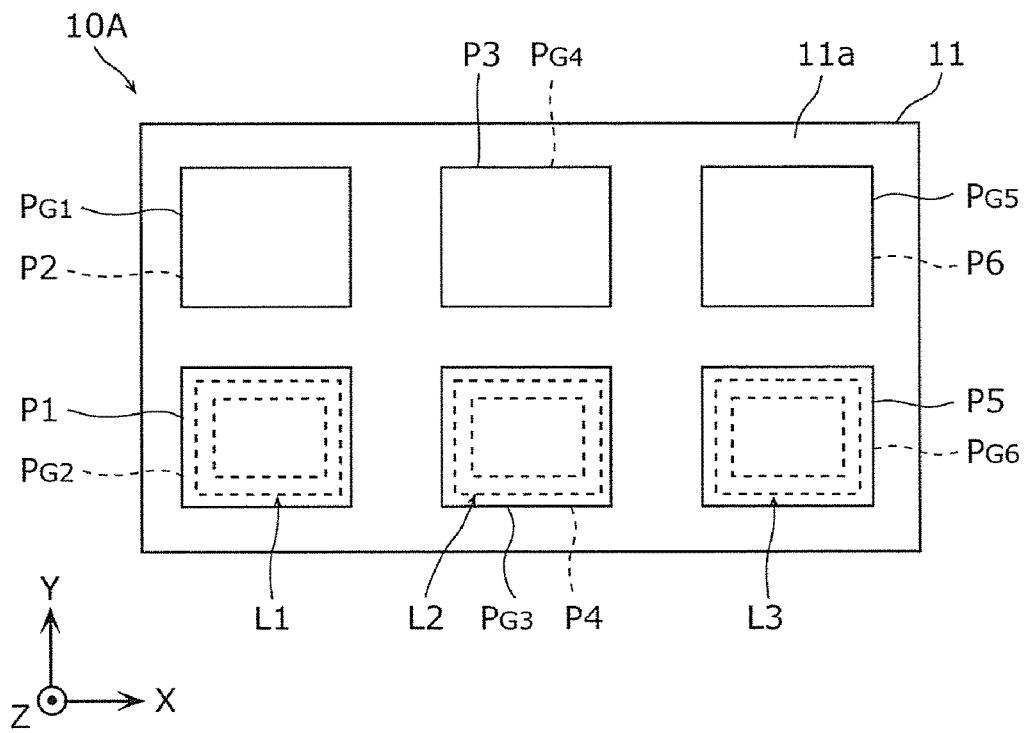
FIG. 8B is a diagram illustrating the passive element array according to the second preferred embodiment of the present invention when viewed from a lamination direction.

FIG. 7 is a schematic view of the passive element array 10A according to the second preferred embodiment. FIG. 8A is a cross-sectional schematic view of the passive element array 10A when viewed from the Y direction. FIG. 8B is a diagram illustrating the passive element array 10A when viewed from the lamination direction Z.

First, a configuration of the passive element array 10A according to the present preferred embodiment will be explained with reference to FIGS. 7, 8A, and 8B.

In the passive element array 10A, the second input/output terminal P2 faces the first ground terminal $P_{G1}$ in the lamination direction Z, and the second ground terminal $P_{G2}$ faces the first input/output terminal P1 in the lamination direction Z. The first passive element L1 is provided in a region overlapping the first input/output terminal P1 when viewed from the lamination direction Z. The other end of the first passive element L1 is connected to the second input/output terminal P2.

Furthermore, the fourth input/output terminal P4 faces the third ground terminal $P_{G3}$ in the lamination direction Z, and the fourth ground terminal $P_{G4}$ faces the third input/output terminal P3 in the lamination direction Z. The second passive element L2 is provided in a region overlapping the third ground terminal $P_{G3}$ when viewed from the lamination direction Z. One end of the second passive element L2 is connected to the third input/output terminal P3.

Furthermore, the sixth input/output terminal P6 faces the fifth ground terminal $P_{G5}$ in the lamination direction Z, and the sixth ground terminal $P_{G6}$ faces the fifth input/output terminal P5 in the lamination direction Z. The third passive element L3 is provided in a region overlapping the fifth input/output terminal P5 when viewed from the lamination direction Z. The other end of the third passive element L3 is connected to the sixth input/output terminal P6.

In the passive element array 10A according to the present preferred embodiment, at the one main surface 11a, the third ground terminal $P_{G3}$ is provided between the first input/output terminal P1 and the fifth input/output terminal P5. Therefore, isolation between the first input/output terminal P1 and the fifth input/output terminal P5 is ensured. Furthermore, in the passive element array 10A, at the second main surface 11b, the fourth ground terminal $P_{G4}$ is provided between the second input/output terminal P2 and the sixth input/output terminal P6. Therefore, isolation between the second input/output terminal P2 and the sixth input/output terminal P6 is ensured.

Figure 9:
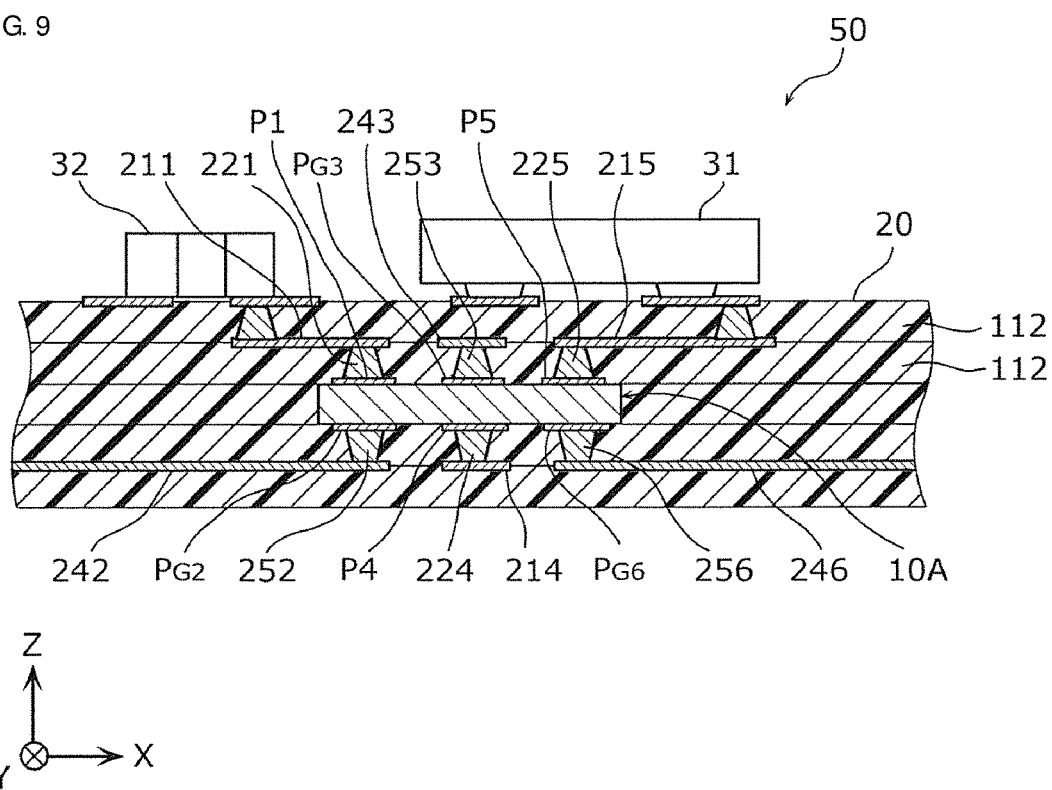
FIG. 9 is a cross-sectional schematic view of a printed wiring board according to the second preferred embodiment of the present invention when viewed from the Y direction.
Figure 10A:
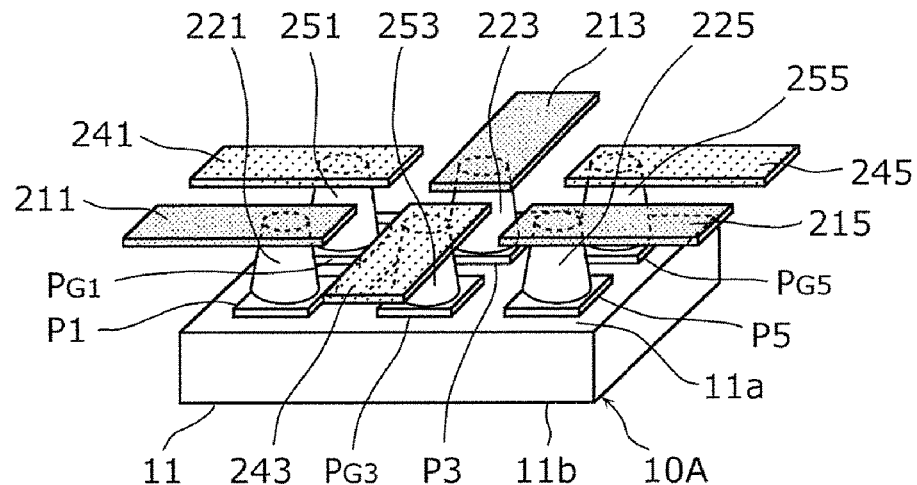
FIG. 10A is a diagram illustrating a connection structure at a first main surface of the passive element array in the printed wiring board according to the second preferred embodiment of the present invention.
Figure 10A:
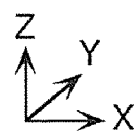
Figure 10B:
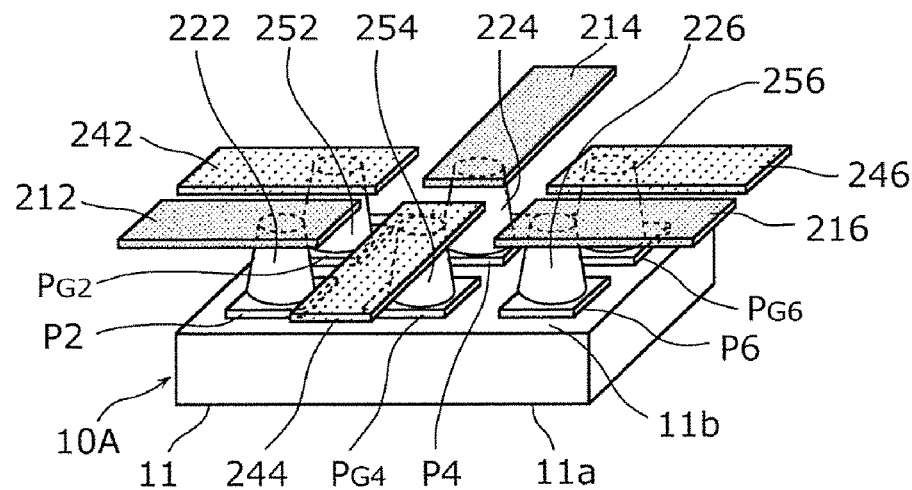
FIG. 10B is a diagram illustrating a connection structure at a second main surface of the passive element array in the printed wiring board according to the second preferred embodiment of the present invention.
Figure 10B:
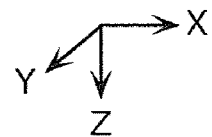

FIG. 9 is a cross-sectional schematic view of the printed wiring board 20 according to the second preferred embodiment when viewed from the Y direction. FIG. 10A is a diagram illustrating a connection structure at the first main surface 11a of the passive element array 10A provided in the printed wiring board 20. FIG. 10B is a diagram illustrating a connection structure at the second main surface 11b of the passive element array 10A provided in the printed wiring board 20.

The connection structure at the first main surface 11a of the passive element array 10A illustrated in FIG. 9 and FIG. 10A is the same or substantially the same as that of the passive element array 10 illustrated in the first preferred embodiment. In the second preferred embodiment, explanation for components at the first main surface 11a of the passive element array 10A will be omitted.

Furthermore, the connection structure at the second main surface 11b of the passive element array 10A illustrated in FIG. 10B is partially different from that of the passive element array 10 illustrated in the first preferred embodiment in arrangement and orientation of input/output terminals, ground terminals, via conductors, signal lines, and ground lines. However, functions of the components at the second main surface 11b of the passive element array 10A are the same or substantially the same as those of the passive element array 10. For the second main surface 11b, components common to those in the first preferred embodiment will be referred to with the same signs, and explanation for those common components will be omitted.

In the printed wiring board 20 according to the second preferred embodiment, the ground line 243 is disposed between the signal line 211 and the signal line 215. Therefore, isolation between the signal line 211 and the signal line 215 is ensured.

Furthermore, in the printed wiring board 20, the ground line 244 is disposed between the signal line 212 and the signal line 216. Therefore, isolation between the signal line 212 and the signal line 216 is ensured.

Third Preferred Embodiment

A passive element array 10B according to a third preferred embodiment of the present invention includes three capacitors corresponding to the three coil elements illustrated in the second preferred embodiment.

Figure 11:
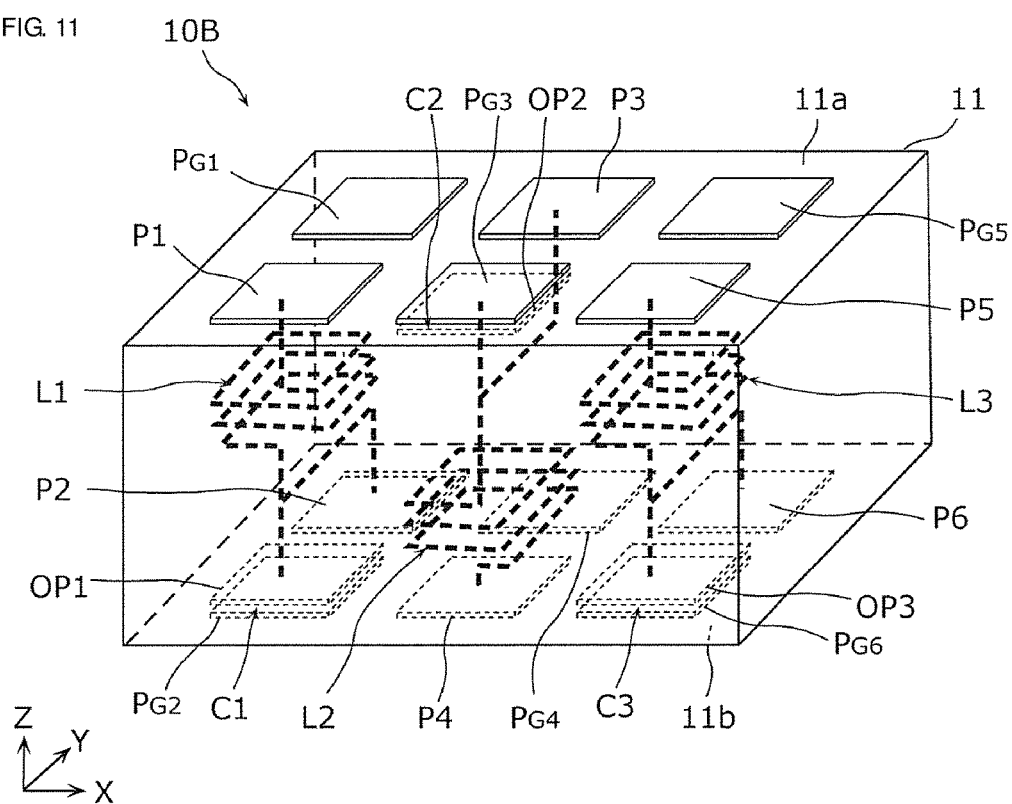
FIG. 11 is a schematic view of a passive element array according to a third preferred embodiment of the present invention.
Figure 12:
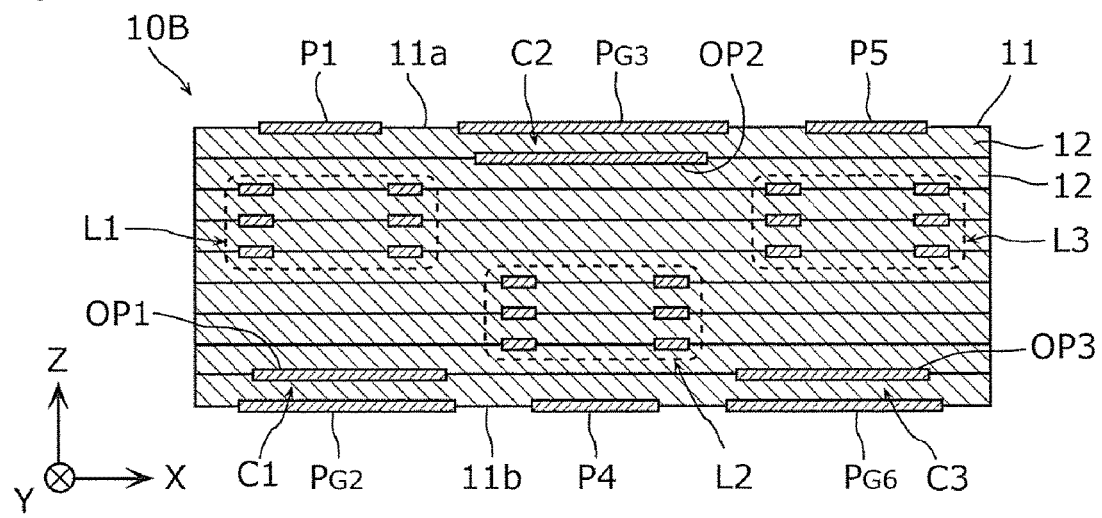
FIG. 12 is a cross-sectional schematic view of the passive element array according to the third preferred embodiment of the present invention when viewed from a Y direction.
Figure 13:
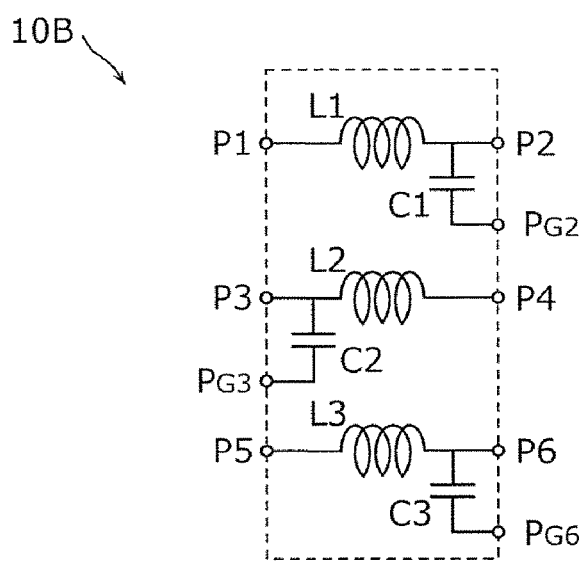
FIG. 13 is a diagram illustrating an equivalent circuit of the passive element array according to the third preferred embodiment of the present invention.

FIG. 11 is a schematic view of the passive element array 10B according to the third preferred embodiment. FIG. 12 is a cross-sectional schematic view of the passive element array 10B when viewed from the Y direction. FIG. 13 is a diagram illustrating an equivalent circuit of the passive element array 10B.

As illustrated in FIG. 11 and FIG. 12, the passive element array 10B includes a first facing electrode OP1, a second facing electrode OP2, and a third facing electrode OP3 in the element body 11.

The first facing electrode OP1 is preferably a flat internal electrode and faces the second ground terminal $P_{G2}$. The first facing electrode OP1 and the second ground terminal $P_{G2}$ face each other to define a first capacitor C1. The first facing electrode OP1 is connected to one end or the other end of the first passive element L1. In the present preferred embodiment, the first facing electrode OP1 is connected between the other end of the first passive element L1 and the second input/output terminal P2.

The second facing electrode OP2 is preferably a flat internal electrode and faces the third ground terminal $P_{G3}$. The second facing electrode OP2 and the third ground terminal $P_{G3}$ face each other to define a second capacitor C2. The second facing electrode OP2 is connected to one end or the other end of the second passive element L2. In the present preferred embodiment, the second facing electrode OP2 is connected between one end of the second passive element L2 and the third input/output terminal P3.

The third facing electrode OP3 is preferably a flat internal electrode and faces the sixth ground terminal $P_{G6}$. The third facing electrode OP3 and the sixth ground terminal $P_{G6}$ face each other to define a third capacitor C3. The third facing electrode OP3 is connected to one end or the other end of the third passive element L3. In the present preferred embodiment, the third facing electrode OP3 is connected between the other end of the third passive element L3 and the sixth input/output terminal P6.

Accordingly, as illustrated in FIG. 13, the passive element array 10B preferably includes three LC filters (low pass filters), for example.

In the present preferred embodiment, in the case in which the first passive element L1, the second passive element L2, and the third passive element L3 are viewed from the X direction, the second passive element L2 overlaps a portion of the first passive element L1 and a portion of the third passive element L3.

Layers between the first facing electrode OP1 and the second ground terminal $P_{G2}$, between the second facing electrode OP2 and the third ground terminal $P_{G3}$, and between the third facing electrode OP3 and the sixth ground terminal $P_{G6}$ may preferably be made of a dielectric material, for example. In this case, capacitances of the first capacitor C1, the second capacitor C2, and the third capacitor C3 may be increased.

Fourth Preferred Embodiment

A passive element array 10C according to a fourth preferred embodiment of the present invention is different from the passive element array 10A according to the second preferred embodiment in the arrangement of the passive elements L1 and L3.

Figure 14:
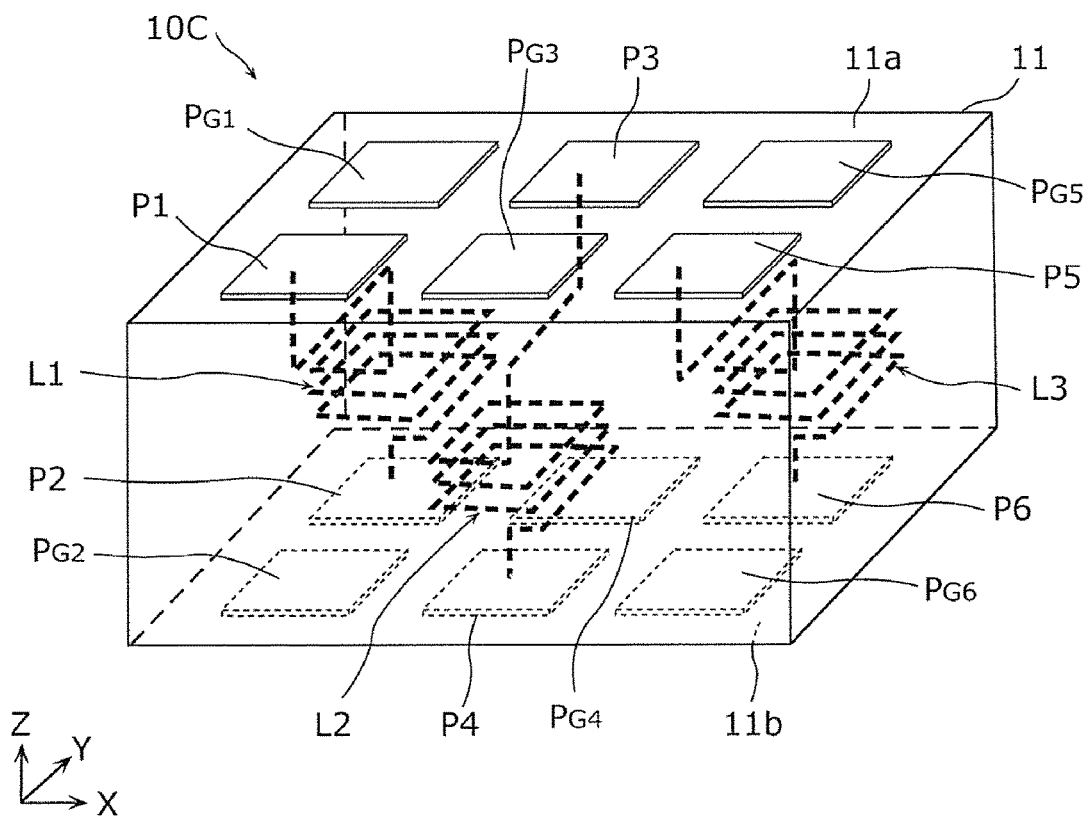
FIG. 14 is a schematic view of a passive element array according to a fourth preferred embodiment of the present invention.
Figure 15A:
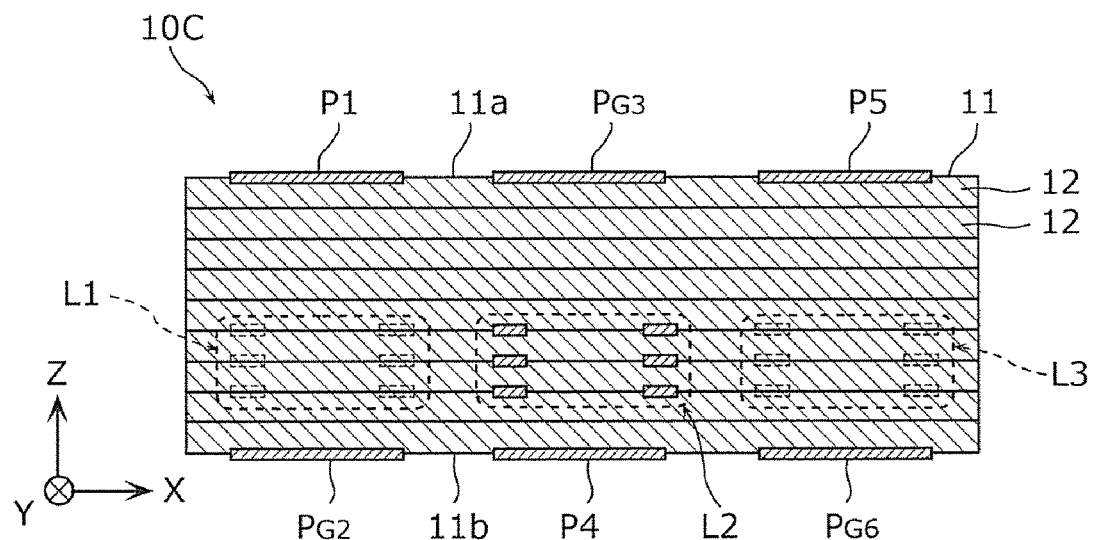
FIG. 15A is a cross-sectional schematic view of the passive element array according to the fourth preferred embodiment of the present invention when viewed from a Y direction.
Figure 15B:
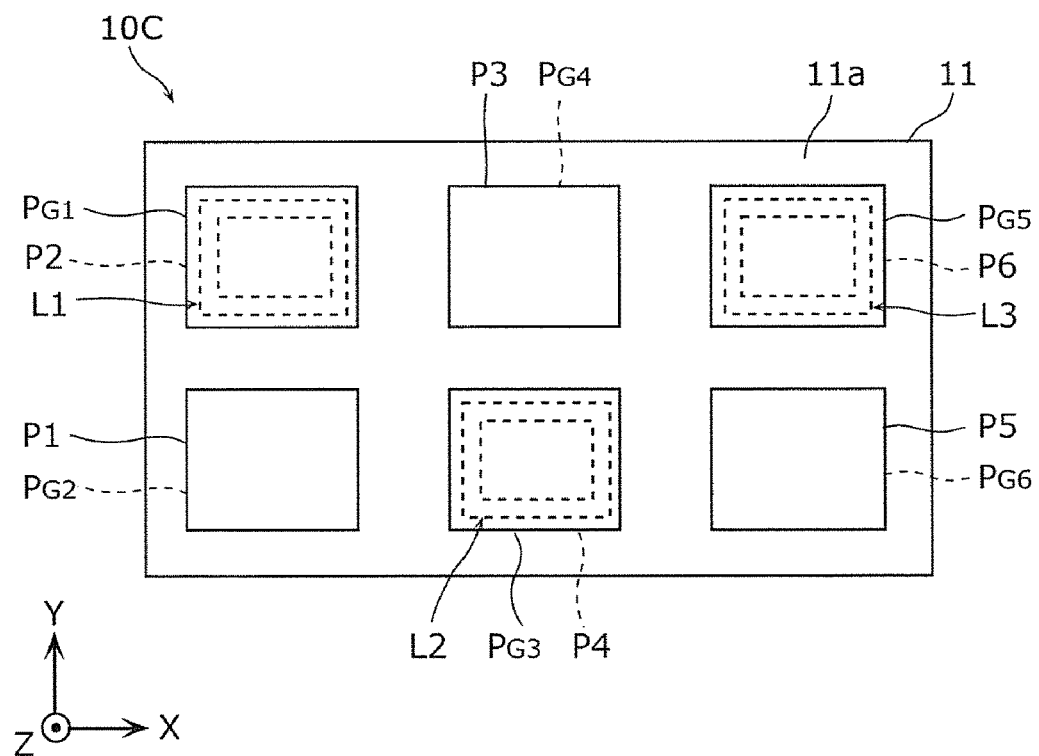
FIG. 15B is a diagram illustrating the passive element array according to the fourth preferred embodiment of the present invention when viewed from a lamination direction.

FIG. 14 is a schematic view of the passive element array 10C according to the fourth preferred embodiment. FIG. 15A is a cross-sectional schematic view of the passive element array 10C when viewed from the Y direction. FIG. 15B is a diagram illustrating the passive element array 10C when viewed from the lamination direction Z.

In the passive element array 10C, when viewed from the lamination direction Z, the first passive element L1 is provided in a region overlapping the first ground terminal $P_{G1}$, the second passive element L2 is provided in a region overlapping the third ground terminal $P_{G3}$, and the third passive element L3 is provided in a region overlapping the fifth ground terminal $P_{G5}$. That is, the first passive element L1 and the third passive element L3 are displaced with respect to the second passive element L2 by a specific distance in the positive Y direction. Accordingly, interference of signals between the first passive element L1 and the second passive element L2 and interference of signals between the second passive element L2 and the third passive element L3 is reduced or prevented.

Furthermore, the first passive element L1 is spaced away from the first ground terminal $P_{G1}$ and close to the second input/output terminal P2, the second passive element L2 is spaced away from the third ground terminal $P_{G3}$ and close to the fourth input/output terminal P4, and the third passive element L3 is spaced away from the fifth ground terminal $P_{G5}$ and close to the sixth input/output terminal P6. By spacing the passive elements L1, L2, and L3, which are coil elements, away from the ground terminals, $P_{G1}$, $P_{G3}$, and $P_{G5}$, respectively, as described above, a situation in which the ground terminals $P_{G1}$, $P_{G3}$, and $P_{G5}$ prevent formation of magnetic fields is reduced or prevented.

In the passive element array 10C according to the present preferred embodiment, at the one main surface 11a, the third ground terminal $P_{G3}$ is provided between the first input/output terminal P1 and the fifth input/output terminal P5. Therefore, isolation between the first input/output terminal P1 and the fifth input/output terminal P5 is ensured. Furthermore, in the passive element array 10C, at the second main surface 11b, the fourth ground terminal $P_{G4}$ is provided between the second input/output terminal P2 and the sixth input/output terminal P6. Therefore, isolation between the second input/output terminal P2 and the sixth input/output terminal P6 is ensured.

Fifth Preferred Embodiment

Figure 16A:
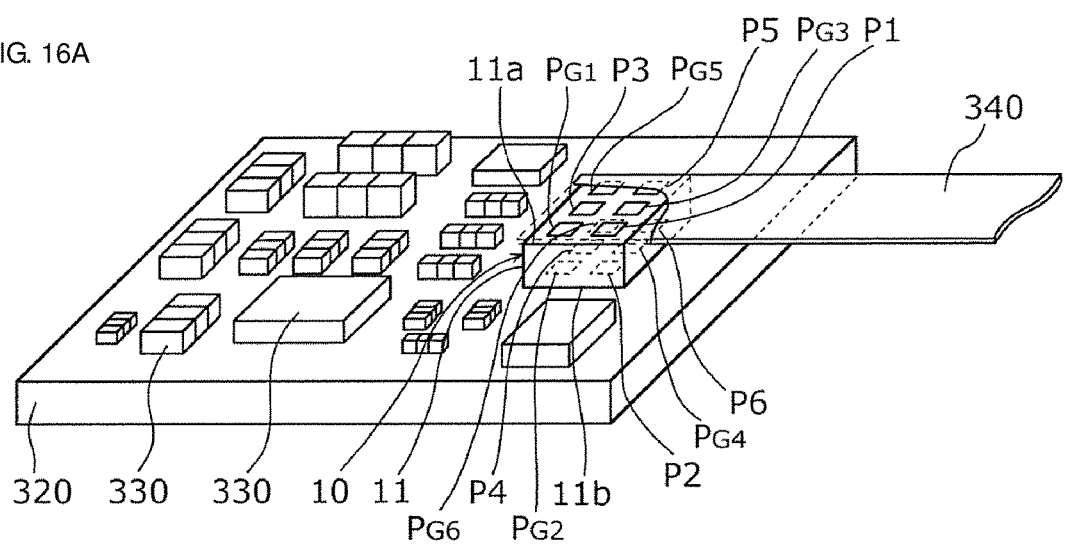
FIG. 16A is a perspective view of a printed wiring board on which the passive element array according to the first preferred embodiment of the present invention is mounted.

In a fifth preferred embodiment of the present invention, a printed wiring board 320 on which the passive element array 10 according to the first preferred embodiment is mounted will be explained. FIG. 16A is a perspective view of the printed wiring board 320 on which the passive element array 10 is mounted. In FIG. 16A, a state in which a portion of a flexible cable 340 is cut out is illustrated.

The printed wiring board 320 in the present preferred embodiment is a motherboard provided in an electronic apparatus. As illustrated n FIG. 16A, the passive element array 10 and a plurality of surface mount components 330 (for example, a switching IC, a chip capacitor, etc.) are mounted on the printed wiring board 320.

The flexible cable 340 is connected to the passive element array 10 mounted on the printed wiring board 320. Specifically, each of the first input/output terminal P1, the third input/output terminal P3, the fifth input/output terminal P5, the first ground terminal $P_{G1}$, the third ground terminal $P_{G3}$, and the fifth ground terminal $P_{G5}$ on the first main surface 11a side of the passive element array 10 is joined to the flexible cable 340 by soldering or other suitable conductive adhesive, for example. Furthermore, each of the second input/output terminal P2, the fourth input/output terminal P4, the sixth input/output terminal P6, the second ground terminal $P_{G2}$, the fourth ground terminal $P_{G4}$, and the sixth ground terminal $P_{G6}$ on the second main surface 11b side of the passive element array 10 is joined to the printed wiring board 320 by soldering or other suitable conductive adhesive, for example. That is, the flexible cable 340 and the printed wiring board 320 are connected with the element body 11 of the passive element array 10 interposed therebetween, and the passive element array 10 is an interposer for the flexible cable 340 and the printed wiring board 320. Hereinafter, the first input/output terminal P1, the third input/output terminal P3, the fifth input/output terminal P5, the first ground terminal $P_{G1}$, the third ground terminal $P_{G3}$, and the fifth ground terminal $P_{G5}$ will be generically called terminals on the one main surface 11a side. Hereinafter, the second input/output terminal P2, the fourth input/output terminal P4, the sixth input/output terminal P6, the second ground terminal $P_{G2}$, the fourth ground terminal $P_{G4}$, and the sixth ground terminal $P_{G6}$ will be generically referred to as terminals on the second main surface 11b side.

The passive element array 10 according to the first preferred embodiment is mounted on the printed wiring board 320 according to the present preferred embodiment. The terminals on the second main surface 11b side of the passive element array 10 are connected to the printed wiring board 320. Furthermore, the terminals on the first main surface 11a side of the passive element array 10 are connected to the flexible cable 340.

With the printed wiring board 320, at least one ground terminal is provided on the first main surface 11a side of the passive element array 10. Therefore, isolation in a region of the flexible cable 340 that is connected to the first main surface 11a side is ensured. Furthermore, at least one ground terminal is provided on the second main surface 11b side of the passive element array 10. Therefore, isolation in a region of the printed wiring board 320 that is connected to the other main surface 11b side is ensured.

Figure 16B:
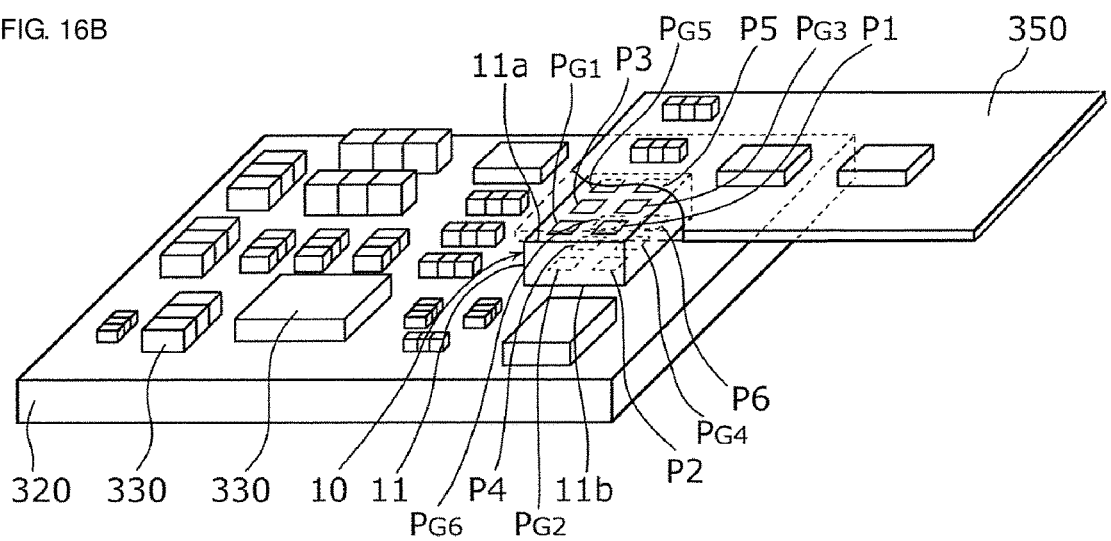
FIG. 16B is a perspective view illustrating another example of a printed wiring board on which the passive element array according to the first preferred embodiment of the present invention is mounted.

In FIG. 16A, an example in which the flexible cable 340 is connected to the passive element array 10 is illustrated. However, preferred embodiments of the present invention are not limited to this configuration. For example, as illustrated in FIG. 16B, a flexible wiring board 350 may be connected to the passive element array 10. That is, a structure in which the passive element array 10 illustrated in the first preferred embodiment is mounted on the printed wiring board 320 and the terminals on the first main surface 11a side of the passive element array 10 are connected to the flexible wiring board 350, is also possible.

Furthermore, in the present preferred embodiment, the passive element array 10 illustrated in the first preferred embodiment is explained as an example of a passive element array. However, the passive element array is not limited to the passive element array 10. The passive element array 10A illustrated in the second preferred embodiment, the passive element array 10B illustrated in the third preferred embodiment, or the passive element array 10C illustrated in the fourth preferred embodiment may be mounted on the printed wiring board 320.

That is, a structure in which the passive element array 10A illustrated in the second preferred embodiment is mounted on the printed wiring board 320, each of the terminals on the second main surface 11b side of the passive element array 10A is connected to the printed wiring board 320, and each of the terminals on the first main surface 11a side of the passive element array 10A is connected to the flexible cable 340 or the flexible wiring board 350, may be provided.

Furthermore, a structure in which the passive element array 10B illustrated in the third preferred embodiment is mounted on the printed wiring board 320, each of the terminals on the second main surface 11b side of the passive element array 10B is connected to the printed wiring board 320, and each of the terminals on the first main surface 11a side of the passive element array 10B is connected to the flexible cable 340 or the flexible wiring board 350, may be provided.

Furthermore, a structure in which the passive element array 10C illustrated in the fourth preferred embodiment is mounted on the printed wiring board 320, each of the terminals on the second main surface 11b side of the passive element array 10C is connected to the printed wiring board 320, and each of the terminals on the first main surface 11a side of the passive element array 10C is connected to the flexible cable 340 or the flexible wiring board 350, may be provided.

The passive element arrays 10, 10A, 10B, and 10C and the printed wiring boards 20 and 320 according to the first, second, third, fourth, and fifth preferred embodiments of the present invention are described above. However, the present invention is not limited to each of the first, second, third, fourth, and fifth preferred embodiments. Various modifications conceived by those skilled in the art made to the first, second, third, fourth, and fifth preferred embodiments and those obtained by combining components in different preferred embodiments may also be included in one or a plurality of preferred embodiments of the present invention as long as they do not depart from the scope of the present invention.

For example, a passive element array may include four or more passive elements. That is, a passive element array may have a structure in which a plurality of passive element units each including a set of a passive element, a pair of input/output terminals, and a pair of ground terminals are sequentially arranged. Accordingly, a ground terminal at an even-numbered location may be provided between input/output terminals for passive elements at odd-numbered locations, and a ground terminal at an odd-numbered location may be provided between input/output terminals of passive element units at even-numbered locations. Thus, isolation between input/output terminals of passive element units is ensured.

Furthermore, in the first, second, third, fourth, and fifth preferred embodiments, inductors are explained as an example of passive elements. However, passive elements are not necessarily inductors. Passive elements may be capacitors including a plurality of facing electrodes. In this case, the input/output terminals P1 and P2 may be connected to one end and the other end of the first passive element L1, which is a capacitor, the input/output terminals P3 and P4 may be connected to one end and the other end of the second passive element L2, which is a capacitor, and the input/output terminals P5 and P6 may be connected one end and the other end of the third passive element L3, which is a capacitor.

Furthermore, in the first preferred embodiment, the first passive element L1 and the second passive element L2 do not overlap when viewed from the X direction. However, the arrangement of the first passive element L1 and the second passive element L2 is not limited to this. The first passive element L1 and the second passive element L2 may partially overlap each other.

Furthermore, in the first preferred embodiment, the first passive element L1 and the third passive element L3 are close to the first main surface 11a side and the second passive element L2 is close to the second main surface 11b side. However, lead-out conductors connecting the passive elements and the input/output terminals may be extended in the lamination direction Z, so that the first passive element L1 and the third passive element L3 may be close to the second main surface 11b side and the second passive element L2 may be close to the first main surface 11a side.

Furthermore, in the first preferred embodiment, the first passive element L1 is a coil element. However, the first passive element L1 is not limited to this. The first passive element L1 may include two coil elements that are disposed in line in the Y direction and connected in series. Furthermore, each of the second passive element L2 and the third passive element L3 may include two coil elements that are disposed in line in the Y direction and connected in series.

Passive element arrays according to preferred embodiments of the present invention may be provided, for example, in a printed wiring board. Furthermore, printed wiring boards according to preferred embodiments of the present invention may be widely used as substrates for high-frequency modules, such as DC-DC converters.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A passive element array that is provided in a printed wiring board, the passive element array comprising:
   an element body that includes a plurality of laminated base material layers;
   a first passive element, a second passive element, and a third passive element that are provided at different positions in the element body when viewed from a lamination direction of the base material layers;
   a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body;
   a second input/output terminal that is connected to another end of the first passive element, a fourth input/output terminal that is connected to another end of the second passive element, and a sixth input/output terminal that is connected to another end of the third passive element, the second input/output terminal, the fourth input/output terminal, and the sixth input/output terminal being provided at a second main surface of the element body;
   a first ground terminal on a side of the first main surface that is provided at the first main surface at least at one of a position between the first input/output terminal and the fifth input/output terminal, a position between the first input/output terminal and the third input/output terminal, and a position between the third input/output terminal and the fifth input/output terminal; and
   a second ground terminal on a side of the second main surface that is provided at the second main surface at least at one of a position between the second input/output terminal and the sixth input/output terminal, a position between the second input/output terminal and the fourth input/output terminal, and a position between the fourth input/output terminal and the sixth input/output terminal.

2. The passive element array according to claim 1, wherein
   the first passive element, the second passive element, and the third passive element are disposed in order in a direction perpendicular or substantially perpendicular to the lamination direction, when viewed from the lamination direction;
   the first ground terminal on the first main surface side is provided between the first input/output terminal and the fifth input/output terminal; and
   the second ground terminal on the second main surface side is provided between the second input/output terminal and the sixth input/output terminal.

3. The passive element array according to claim 1, wherein when the element body is viewed from the lamination direction:
   the first input/output terminal and the second input/output terminal overlap the first passive element;
   the third input/output terminal and the fourth input/output terminal overlap the second passive element; and the fifth input/output terminal and the sixth input/output terminal overlap the third passive element.

4. The passive element array according to claim 1, wherein, when the element body is viewed from the lamination direction, at least one of the first ground terminal on the first main surface side and the second ground terminal on the second main surface side overlaps the second passive element.

5. The passive element array according to claim 4, wherein
the first ground terminal on the first main surface side and the second ground terminal on the second main surface side define a third ground terminal and a fourth ground terminal, respectively;
the passive element array further includes:
a first ground terminal and a fifth ground terminal that are provided at the first main surface; and
a second ground terminal and a sixth ground terminal that are provided at the second main surface and
when viewed from the lamination direction:
at least one of the first ground terminal and the second ground terminal overlaps the first passive element; and
at least one of the fifth ground terminal and the sixth ground terminal overlaps the third passive element.

6. The passive element array according to claim 5, wherein
the first input/output terminal, the third input/output terminal, the fifth input/output terminal, the first ground terminal, the third ground terminal, and the fifth ground terminal are disposed in a matrix at the first main surface, and the first input/output terminal, the third input/output terminal, and the fifth input/output terminal, and the first ground terminal, the third ground terminal, and the fifth ground terminal are disposed in order alternately along an arrangement direction in which the first passive element, the second passive element, and the third passive element are disposed, when viewed from the lamination direction; and
the second input/output terminal, the fourth input/output terminal, the sixth input/output terminal, the second ground terminal, the fourth ground terminal, and the sixth ground terminal are disposed in a matrix at the second main surface, and the second input/output terminal, the fourth input/output terminal, and the sixth input/output terminal, and the second ground terminal, the fourth ground terminal, and the sixth ground terminal are disposed in order alternately along the arrangement direction, when viewed from the lamination direction.

7. The passive element array according to claim 5, further comprising:
a first facing electrode that faces the second ground terminal, a second facing electrode that faces the third ground terminal, and a third facing electrode that faces the sixth ground terminal, the first facing electrode, the second facing electrode, and the third facing electrode being provided in the element body; wherein
the first facing electrode is connected to one end or another end of the first passive element;
the second facing electrode is connected to one end or another end of the second passive element; and
the third facing electrode is connected to one end or another end of the third passive element.

8. The passive element array according to claim 1, wherein at least one of the first passive element, the second passive element, and the third passive element is provided at a position different in the lamination direction from another of the first, second, and third passive elements.

9. The passive element array according to claim 1, wherein the first passive element and the third passive element are provided at positions closer to the first main surface than to the second main surface, and the second passive element is provided at a position closer to the second main surface than to the first main surface.

10. The passive element array according to claim 1, wherein each of the first passive element, the second passive element, and the third passive element is an inductor.

11. A passive element array that is mounted on a printed wiring board, the passive element array comprising:
an element body that includes a plurality of laminated base material layers;
a first passive element, a second passive element, and a third passive element that are provided at different positions in the element body when viewed from a lamination direction of the base material layers;
a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body;
a second input/output terminal that is connected to another end of the first passive element, a fourth input/output terminal that is connected to another end of the second passive element, and a sixth input/output terminal that is connected to another end of the third passive element, the second input/output terminal, the fourth input/output terminal, and the sixth input/output terminal being provided at a second main surface of the element body;
a first ground terminal on a side of the first main surface that is provided at the first main surface at least at one of a position between the first input/output terminal and the fifth input/output terminal, a position between the first input/output terminal and the third input/output terminal, and a position between the third input/output terminal and the fifth input/output terminal; and
a second ground terminal on a side of the second main surface that is provided at the second main surface at least at one of a position between the second input/output terminal and the sixth input/output terminal, a position between the second input/output terminal and the fourth input/output terminal, and a position between the fourth input/output terminal and the sixth input/output terminal; wherein
at least one of the terminals on the first main surface side is connected to a flexible wiring board or a flexible cable, and at least one of the terminals on the second main surface side is connected to the printed wiring board.

12. A printed wiring board in which a passive element array is provided, wherein
the passive element array includes:
an element body that includes a plurality of laminated base material layers;
a first passive element, a second passive element, and a third passive element that are provided at different positions in the element body when viewed from a lamination direction of the base material layers;
a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body;

a second input/output terminal that is connected to another end of the first passive element, a fourth input/output terminal that is connected to another end of the second passive element, and a sixth input/output terminal that is connected to the other end of the third passive element, the second input/output terminal, the fourth input/output terminal, and the sixth input/output terminal being provided at another main surface of the element body;

a first ground terminal on a side of the first main surface that is provided at the first main surface at least at one of a position between the first input/output terminal and the fifth input/output terminal, a position between the first input/output terminal and the third input/output terminal, and a position between the third input/output terminal and the fifth input/output terminal; and a second ground terminal on a side of the second main surface side that is provided at the second main surface at least at one of a position between the second input/output terminal and the sixth input/output terminal, a position between the second input/output terminal and the fourth input/output terminal, and a position between the fourth input/output terminal and the sixth input/output terminal.

13. The printed wiring board according to claim 12, wherein
the first passive element, the second passive element, and the third passive element are disposed in order in a direction perpendicular or substantially perpendicular to the lamination direction, when viewed from the lamination direction;
the first ground terminal on the first main surface side is provided between the first input/output terminal and the fifth input/output terminal; and
the second ground terminal on the second main surface side is provided between the second input/output terminal and the sixth input/output terminal.

14. The printed wiring board according to claim 12, wherein
when the element body is viewed from the lamination direction:
the first input/output terminal and the second input/output terminal overlap the first passive element;
the third input/output terminal and the fourth input/output terminal overlap the second passive element; and
the fifth input/output terminal and the sixth input/output terminal overlap the third passive element.

15. The printed wiring board according to claim 12, wherein, when the element body is viewed from the lamination direction, at least one of the first ground terminal on the first main surface side and the second ground terminal on the second main surface side overlaps the second passive element.

16. The printed wiring board according to claim 15, wherein
the first ground terminal on the first main surface side and the second ground terminal on the second main surface side define a third ground terminal and a fourth ground terminal, respectively;

the passive element array further includes:
a first ground terminal and a fifth ground terminal that are provided at the first main surface; and
a second ground terminal and a sixth ground terminal that are provided at the second main surface and
when viewed from the lamination direction:
at least one of the first ground terminal and the second ground terminal overlaps the first passive element; and
at least one of the fifth ground terminal and the sixth ground terminal overlaps the third passive element.

17. The printed wiring board according to claim 16, wherein
the first input/output terminal, the third input/output terminal, the fifth input/output terminal, the first ground terminal, the third ground terminal, and the fifth ground terminal are disposed in a matrix at the first main surface, and the first input/output terminal, the third input/output terminal, and the fifth input/output terminal, and the first ground terminal, the third ground terminal, and the fifth ground terminal are disposed in order alternately along an arrangement direction in which the first passive element, the second passive element, and the third passive element are disposed, when viewed from the lamination direction; and
the second input/output terminal, the fourth input/output terminal, the sixth input/output terminal, the second ground terminal, the fourth ground terminal, and the sixth ground terminal are disposed in a matrix at the second main surface, and the second input/output terminal, the fourth input/output terminal, and the sixth input/output terminal, and the second ground terminal, the fourth ground terminal, and the sixth ground terminal are disposed in order alternately along the arrangement direction, when viewed from the lamination direction.

18. The printed wiring board according to claim 16, further comprising:
a first facing electrode that faces the second ground terminal, a second facing electrode that faces the third ground terminal, and a third facing electrode that faces the sixth ground terminal, the first facing electrode, the second facing electrode, and the third facing electrode being provided in the element body; wherein
the first facing electrode is connected to one end or another end of the first passive element;
the second facing electrode is connected to one end or another end of the second passive element; and
the third facing electrode is connected to one end or another end of the third passive element.

19. The printed wiring board according to claim 12, wherein at least one of the first passive element, the second passive element, and the third passive element is provided at a position different in the lamination direction from another of the first, second, and third passive elements.

20. A printed wiring board on which a passive element array is mounted, wherein
the passive element array includes:
an element body that includes a plurality of laminated base material layers;
a first passive element, a second passive element, and a third passive element that are provided at different positions in the element body when viewed from a lamination direction of the base material layers;
a first input/output terminal that is connected to one end of the first passive element, a third input/output terminal that is connected to one end of the second passive element, and a fifth input/output terminal that is connected to one end of the third passive element, the first input/output terminal, the third input/output terminal, and the fifth input/output terminal being provided at a first main surface of the element body;

a second input/output terminal that is connected to another end of the first passive element, a fourth input/output terminal that is connected to another end of the second passive element, and a sixth input/output terminal that is connected to another end of the third passive element, the second input/output terminal, the fourth input/output terminal, and the sixth input/output terminal being provided at a second main surface of the element body;

a first ground terminal on a side of the first main surface that is provided at the first main surface at least at one of a position between the first input/output terminal and the fifth input/output terminal, a position between the first input/output terminal and the third input/output terminal, and a position between the third input/output terminal and the fifth input/output terminal; and a second ground terminal on a side of the second main surface that is provided at the second main surface at least at one of a position between the second input/output terminal and the sixth input/output terminal, a position between the second input/output terminal and the fourth input/output terminal, and a position between the fourth input/output terminal and the sixth input/output terminal; wherein at least one of the terminals on the first main surface side is connected to a flexible wiring board or a flexible cable, and at least one of the terminals on the second main surface side is connected to the printed wiring board.

\* \* \* \* \*